United States Patent
Bash et al.

(10) Patent No.: US 7,031,802 B2
(45) Date of Patent: Apr. 18, 2006

(54) SEMI-AUTONOMOUS OPERATION OF A ROBOTIC DEVICE

(75) Inventors: Cullen E. Bash, San Francisco, CA (US); Chandrakant D. Patel, Fremont, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 250 days.

(21) Appl. No.: 10/639,428

(22) Filed: Aug. 13, 2003

(65) Prior Publication Data

US 2005/0038562 A1    Feb. 17, 2005

(51) Int. Cl.
*G06F 7/00*    (2006.01)

(52) U.S. Cl. ............... 700/214; 700/215; 700/246; 700/247; 700/248; 700/249; 700/254; 700/258; 700/259; 700/260; 700/261; 700/245; 318/567; 318/568.1; 250/302; 408/197; 62/97

(58) Field of Classification Search ........ 700/214–215, 700/245–249, 254, 258–261, 28–30, 276; 318/567, 568.1; 250/302; 406/197–198; 62/97, 263
See application file for complete search history.

(56) References Cited

U.S. PATENT DOCUMENTS

| | | | |
|---|---|---|---|
| 4,483,920 A | 11/1984 | Gillespie et al. | |
| 4,935,142 A | 6/1990 | Sternberg | |
| 4,935,342 A | 6/1990 | Seligson et al. | |
| 5,057,426 A | 10/1991 | Henco et al. | |
| 5,151,189 A | 9/1992 | Hu et al. | |
| 5,155,018 A | 10/1992 | Gillespie et al. | |
| 5,187,083 A | 2/1993 | Mullis | |
| 5,234,809 A | 8/1993 | Boom et al. | |
| 5,234,824 A | 8/1993 | Mullis | |
| 5,438,128 A | 8/1995 | Nieuwkerk et al. | |
| 5,596,507 A * | 1/1997 | Jones et al. ................ | 700/276 |
| 5,637,687 A | 6/1997 | Wiggins | |
| 5,958,677 A | 9/1999 | Lee et al. | |
| 6,020,186 A | 2/2000 | Henco et al. | |
| 6,274,308 B1 | 8/2001 | Lee et al. | |
| 6,277,648 B1 | 8/2001 | Colpan | |
| 6,351,685 B1 * | 2/2002 | Dimitri et al. ............. | 700/214 |
| 6,383,393 B1 | 5/2002 | Colpan et al. | |
| 6,383,783 B1 | 5/2002 | Haddad | |
| 6,438,459 B1 * | 8/2002 | Dimitri et al. ............. | 700/255 |
| 6,465,640 B1 | 10/2002 | Hood | |
| 6,478,967 B1 | 11/2002 | Muller | |

(Continued)

OTHER PUBLICATIONS

Thrum et al., Probabilistic algorithms and the interactive museum tour-guide robot Minerva, 2000, Internet, pp. 1-35.*

*Primary Examiner*—Thomas G. Black
*Assistant Examiner*—McDieunel Marc
(74) *Attorney, Agent, or Firm*—Richard P. Lange

(57) ABSTRACT

A method for semi-autonomous operation of a robotic device in a room. In the method, one or more goal points are set and the distances between the robotic device and the one or more goal points are determined. A first one of the one or more goal points is selected and the robotic device is maneuvered to travel to the first one of the one or more goal points. In addition, one or more functions at the first one of the one or more goal points with the robotic device are performed

46 Claims, 9 Drawing Sheets

U.S. PATENT DOCUMENTS

| | | |
|---|---|---|
| 6,602,414 B1 | 8/2003 | Warner |
| 6,609,046 B1 * | 8/2003 | Ostwald et al. ............. 700/214 |
| 6,671,580 B1 * | 12/2003 | Campbell et al. ........... 700/245 |
| 2002/0081619 A1 | 6/2002 | Bastian et al. |
| 2002/0127587 A1 | 9/2002 | Simms et al. |
| 2002/0193457 A1 | 12/2002 | Arnold et al. |
| 2003/0073830 A1 | 4/2003 | Heath et al. |
| 2003/0129614 A1 | 7/2003 | Parameswaran et al. |
| 2003/0152974 A1 | 8/2003 | Gauch et al. |
| 2003/0166916 A1 | 9/2003 | Kolzau et al. |
| 2003/0180754 A1 | 9/2003 | Bergholtz et al. |
| 2003/0191302 A1 | 10/2003 | Kolzau et al. |

* cited by examiner

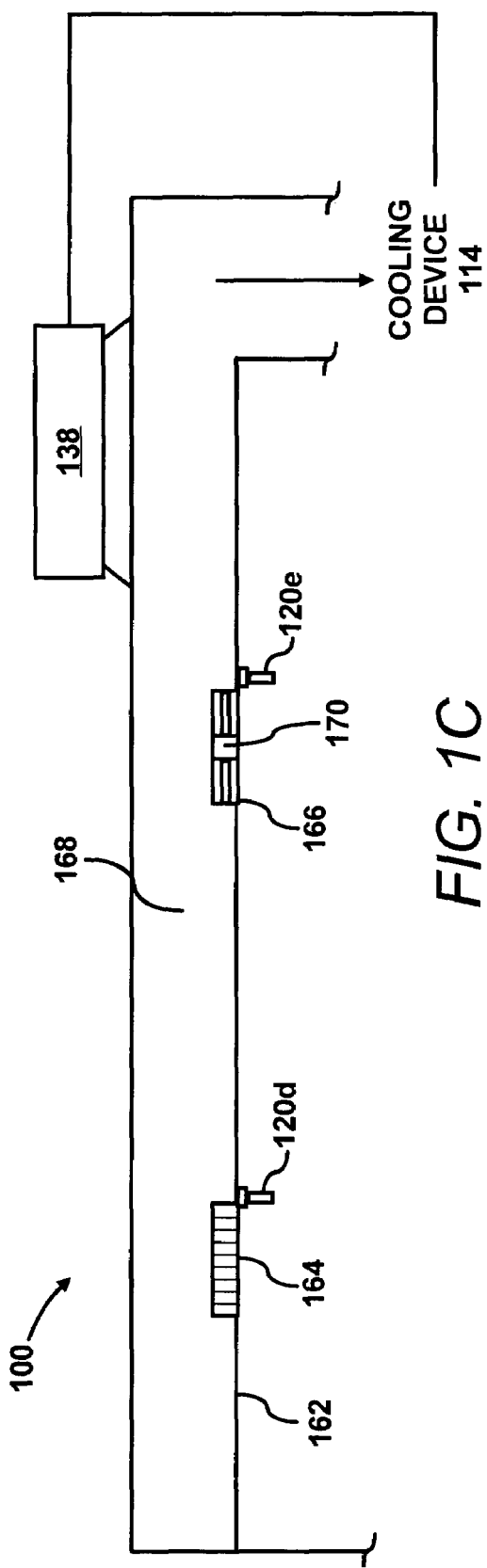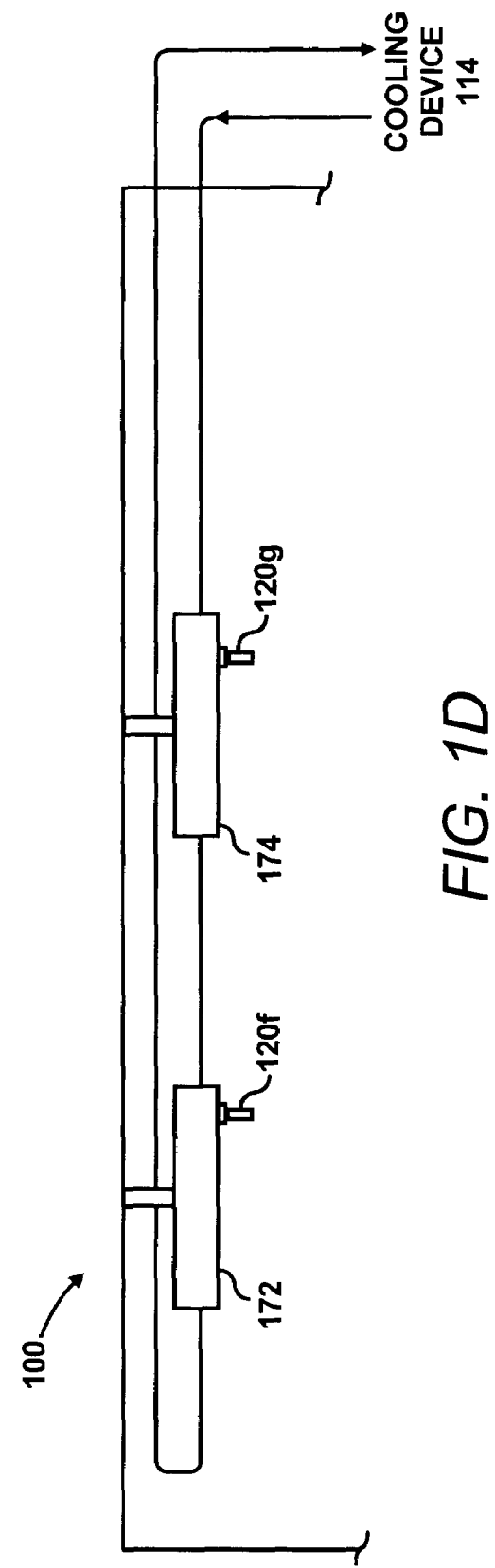

SEMI-AUTONOMOUS OPERATION OF A ROBOTIC DEVICE

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, cooling fluid, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically consume a minimum of about thirty (30) percent of the required operating energy to sufficiently cool the data centers. The other components, e.g., condensers, air movers (fans), etc., typically consume an additional twenty (20) percent of the required total operating energy. As an example, a high density data center with 100 racks, each rack having a maximum power dissipation of 10KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center may only utilize around 30–50% of the maximum cooling capacity. In this respect, conventional cooling systems often attempt to cool components that may not be operating at a level which may cause their temperatures to exceed a predetermined temperature range. Consequently, conventional cooling systems often incur greater amounts of operating expenses than may be necessary to sufficiently cool the heat generating components contained in the racks of data centers.

Another problem associated with the cooling of data centers involves the expense and difficulty in measuring the environmental conditions, e.g., temperature, humidity, air flow, etc., within and around the racks. Although it has been found that the use of temperature sensors, e.g., thermocouples, located at various locations throughout the data center has been a relatively accurate manner of detecting temperatures, this practice has also been found to be relatively restrictive due to the difficulty and costs associated with this implementation. By way of example, a large number of sensors typically must be implemented to adequately detect the environmental conditions throughout the data center.

SUMMARY OF THE INVENTION

According to an embodiment, the present invention pertains to a method for semi-autonomous operation of a robotic device in a room. In the method, one or more goal points are set and the distances between the robotic device and the one or more goal points are determined. A first one of the one or more goal points is selected and the robotic device is maneuvered to travel to the first one of the one or more goal points. In addition, one or more functions at the first one of the one or more goal points with the robotic device are performed.

According to another embodiment, the invention relates to a system for operating a robotic device in a semi-autonomous manner. The system includes a robotic device having a steering and propelling mechanism; a guidance sensor; a device memory configured to store one or more algorithms to operate the steering and propelling mechanism; and a device controller interfaced with the device memory and configured to control the steering and propelling mechanism and the guidance sensor, wherein the device controller is configured to set one or more goal points, calculate the distances between the location of the robotic device and the one or more goal points, select one of the one or more goal points, control the steering and propelling mechanism to maneuver the robotic device to a first one of the one or more goal points, and perform one or more functions at the first one of the one or more goal points.

According to a further embodiment, the present invention relates to a system for operating a robotic device in a semi-autonomous manner. The system includes means for steering and propelling the robotic device; means for guiding the robotic device; means for storing information in the robotic device; and means for controlling the steering and propelling means, the guiding means, and the storing means, wherein the controlling means is configured to set one or more goal points, calculate the distances between the location of the robotic device and the one or more goal points, select one of the one or more goal points, control the steering and propelling mechanism to maneuver the robotic device to a first one of the one or more goal points, and perform one or more functions at the first one of the one or more goal points.

According to yet another embodiment, the invention relates to a computer readable storage medium on which is embedded one or more computer programs. The one or more computer programs are configured to implement a method for semi-autonomous operation of a robotic device. The one or more computer programs include a set of instructions for: setting one or more goal points; calculating the distances between the robotic device and the one or more goal points; selecting a first one of the one or more goal points; maneuvering the robotic device to travel to the first one of the one or more goal points; and performing one or more functions at the first one of the one or more goal points with the robotic device.

BRIEF DESCRIPTION OF THE DRAWINGS

Features of the present invention will become apparent to those skilled in the art from the following description with reference to the figures, in which:

FIG. 1C is a cross-sectional side view of an upper portion of the data center shown in FIGS. 1A and 1B according to an embodiment of the invention;

FIG. 1D is a cross-sectional side view of an upper portion of the data center shown in FIGS. 1A and 1B according to a further embodiment of the invention;

DETAILED DESCRIPTION OF THE INVENTION

Figure 1A:
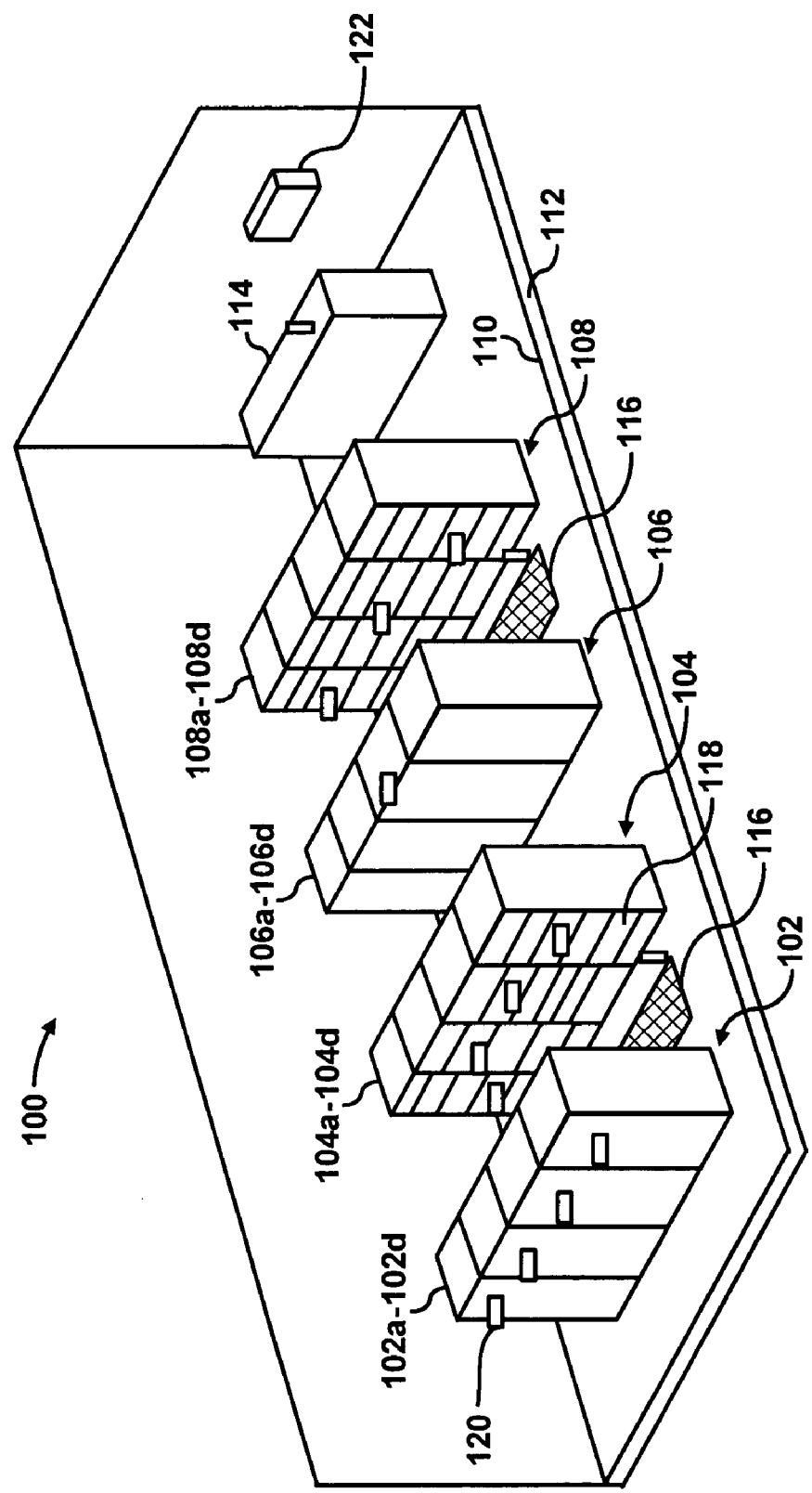
FIG. 1A shows a simplified perspective view of a room, e.g., a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated cooling fluid". For purposes of simplicity, "cooling fluid" may generally be defined as air or other gas that has been cooled by a cooling device, e.g., an air conditioning unit. In addition, "heated cooling fluid" may generally be defined as cooling fluid that has been heated. It should be readily apparent, however, that the terms "cooling fluid" are not intended to denote air that only contains cooled air and that "heated cooling fluid" only contains air that has been heated. Instead, embodiments of the invention may operate with air that contains a mixture of heated cooling fluid and cooling fluid. In addition, cooling fluid and heated cooling fluid may denote gases other than air, e.g., refrigerant and other types of gases known to those of ordinary skill in the art that may be used to cool electronic components.

According to embodiments of the invention, a robotic device is programmed with pre-defined goal points to enable the robotic device to traverse a room in a semi-autonomous manner. In one respect, the robotic device is programmed with the locations of variously categorized areas, e.g., locations of racks, components, and other apparatus in a data center. The robotic device makes decisions on how to traverse the data center based upon the programmed locations. In another respect, the robotic device is programmed to determine locations of potential inefficient energy use. In yet a further respect, the robotic device may be implemented in a room that does not contain a sensor network. Instead, predictive modeling tools may be implemented to categorize and determine the locations of the variously categorized areas.

According to an embodiment, the robotic device is implemented in conjunction with a monitoring system of sensors distributed in the room. The sensors may be positioned at various locations throughout the room and may be configured to detect one or more environmental conditions, e.g., temperature, pressure, humidity, etc. The robotic device may have its own sensors and may be operated in manners that supplement the data collected by the sensors. In one regard, an energy manager, configured to control cooling system components, e.g., vent tiles, air conditioning units, etc., based upon input received from one or more sensors (see, e.g., FIG. 2), may transmit location information, e.g., goal points, to the robotic device to travel and collect data.

The energy manager may be configured to receive environmental condition information from the sensors. The energy manager may also determine whether the received environmental condition information is outside of predetermined ranges and whether the received environmental condition information is within a warning zone. The energy manager may transmit the locations of these detected environmental conditions to the robotic device. The robotic device may use this information in determining the locations of the room where it is to travel.

The robotic device may obtain environmental condition information at the locations. The measurements gathered by the robotic device may be used to more accurately determine causes of the out-of-range environmental conditions. For instance, the robotic device may determine the existence of malfunctioning sensors, blocked vents, etc.

The energy manager may utilize the information gathered by the robotic device to vary cooling fluid provisioning in the room. For instance, the energy manager may direct additional cooling fluid delivery to those areas or racks having temperatures above the predetermined ranges. In addition, or alternatively, the energy manager may cause an air conditioning unit to increase or decrease the cooling fluid temperature and/or cooling fluid flow rate depending upon the gathered environmental condition information.

Through implementation of the robotic device as described hereinabove, the number of sensors required to adequately detect environmental conditions in the room may be substantially reduced in comparison with known detection systems. Moreover, through various embodiments of the invention, the robotic device may be operated in a substantially optimized manner. For instance, the robotic device may be operated to generally avoid gathering unnecessary to duplicative information.

With reference first to FIG. 1A, there is shown a simplified perspective view of a room, e.g., a data center 100, according to an embodiment of the invention. The terms "data center" are generally meant to denote a room or other space and are not meant to limit the invention to any specific type of room where data is communicated or processed, nor should it be construed that use of the terms "data center" limits the invention in any respect other than its definition hereinabove.

It should be readily apparent to those of ordinary skill in the art that the data center 100 depicted in FIG. 1A represents a generalized illustration and that other components may be added or existing components may be removed or modified without departing from the scope of the invention. For example, the data center 100 may include any number of racks and various other components. Thus, although the data center 100 is illustrated as containing four rows of racks 102–108, it should be understood that the data center 100 may include any number of racks, e.g., 100 racks, without departing from the scope of the invention. The depiction of four rows of racks 102–108 is thus for illustrative and simplicity of description purposes only and is not intended to limit the invention in any respect.

The data center 100 is depicted as having a plurality of racks 102–108, e.g., electronics cabinets, aligned in substantially parallel rows. The racks 102–108 are illustrated as having open front sides such that the components 118 housed therein are visible. It should, however, be understood that embodiments of the invention may be practiced with racks having panels that cover the front sides of the racks 102–108 without departing from the scope of the invention. The rows of racks 102–108 are shown as containing four racks (a–d) positioned on a raised floor 110. A plurality of wires and communication lines (not shown) may be located in a space 112 beneath the raised floor 110. The space 112 may also function as a plenum for delivery of cooling fluid from an air conditioning unit 114 to the racks 102–108. The cooling fluid may be delivered from the space 112 to the racks 102–108 through vents 116 located between some or all of the racks 102–108. The vents 116 are shown as being located between racks 102 and 104 and 106 and 108.

The racks 102–108 are generally configured to house a plurality of components 118, e.g., computers, servers, monitors, hard drives, disk drives, etc., designed to perform various operations, e.g., computing, switching, routing, displaying, etc. These components 118 may comprise subsystems (not shown), for example, processors, micro-controllers, high-speed video cards, memories, semi-conductor devices, and the like to perform these functions. In the performance of these electronic functions, the components 118, and therefore the subsystems, may generally dissipate relatively large amounts of heat. Because the racks 102–108 have generally been known to include upwards of forty (40) or more subsystems, they may transfer substantially large amounts of heat to the cooling fluid to maintain the subsystems and the components generally within predetermined operating temperature ranges.

A relatively small number of components 118 are illustrated as being housed in the racks 102–108 for purposes of simplicity. It should, however, be understood that the racks 102–108 may include any number of components 118, e.g., forty or more components 118, without departing from the scope of the invention. In addition, although the racks 102–108 are illustrated as containing components 118 throughout the heights of the racks 102–108, it should be understood that some or all of the racks 102–108 may include slots or areas that do not include components 118 without departing from the scope of the invention.

Sensors 120 configured to detect one or more environmental conditions, e.g., temperature, pressure, humidity, etc., are provided at various locations in the data center 100. For instance, the sensors 120 are illustrated as being located at the outlets of the vents 116, at various locations with respect to the racks 102–108, and the inlet of the air conditioning unit 114. It should be understood that the locations of the sensors 120 illustrated in FIG. 1A are for illustrative purposes only and are not meant to limit the invention. Instead, it should be understood that the sensors 120 may be positioned at any reasonably suitable location where the environmental condition(s) are desired to be measured.

In addition, or alternatively, the sensors 120 may be integrally formed with one or more of the components 118. For instance, one or more of the components 118 may be fabricated to include the sensors 120. In any respect, the environmental condition information obtained by the sensors 120 may be transmitted to an energy manager 122. The communication between the sensors 120 and the energy manager 122 may be effectuated through a wired protocol, such as IEEE 802.3, etc., or wireless protocols, such as IEEE 801.11b, 801.11g, wireless serial connection, Bluetooth, etc., or combinations thereof.

Moreover, the communication between the sensors 120 and the energy manager 122 may be effectuated through location aware devices as described in co-pending and commonly assigned U.S. Patent Application Ser. No. 10/620,272, filed on Jul. 9, 2003, entitled "LOCATION AWARE DEVICES", the disclosure of which is hereby incorporated by reference in its entirety. As described in that application, these devices are termed "location aware" because they are operable to determine their general locations with respect to other sensors and/or devices and to communicate with one another through wireless communications.

Generally speaking, the energy manager 122 may be configured to vary cooling provisions based upon the information received from the sensors 120. By way of example, if a sensor 120 located on the rack 104a detects a temperature that is above a predetermined temperature range, the energy manager 122 may increase or decrease cooling fluid delivery to that location. In addition, or alternatively, the energy manager 122 may vary the output, e.g., temperature and/or volume of cooling fluid, of the air conditioning unit 114 in response to detected temperature measurements.

Figure 1B:
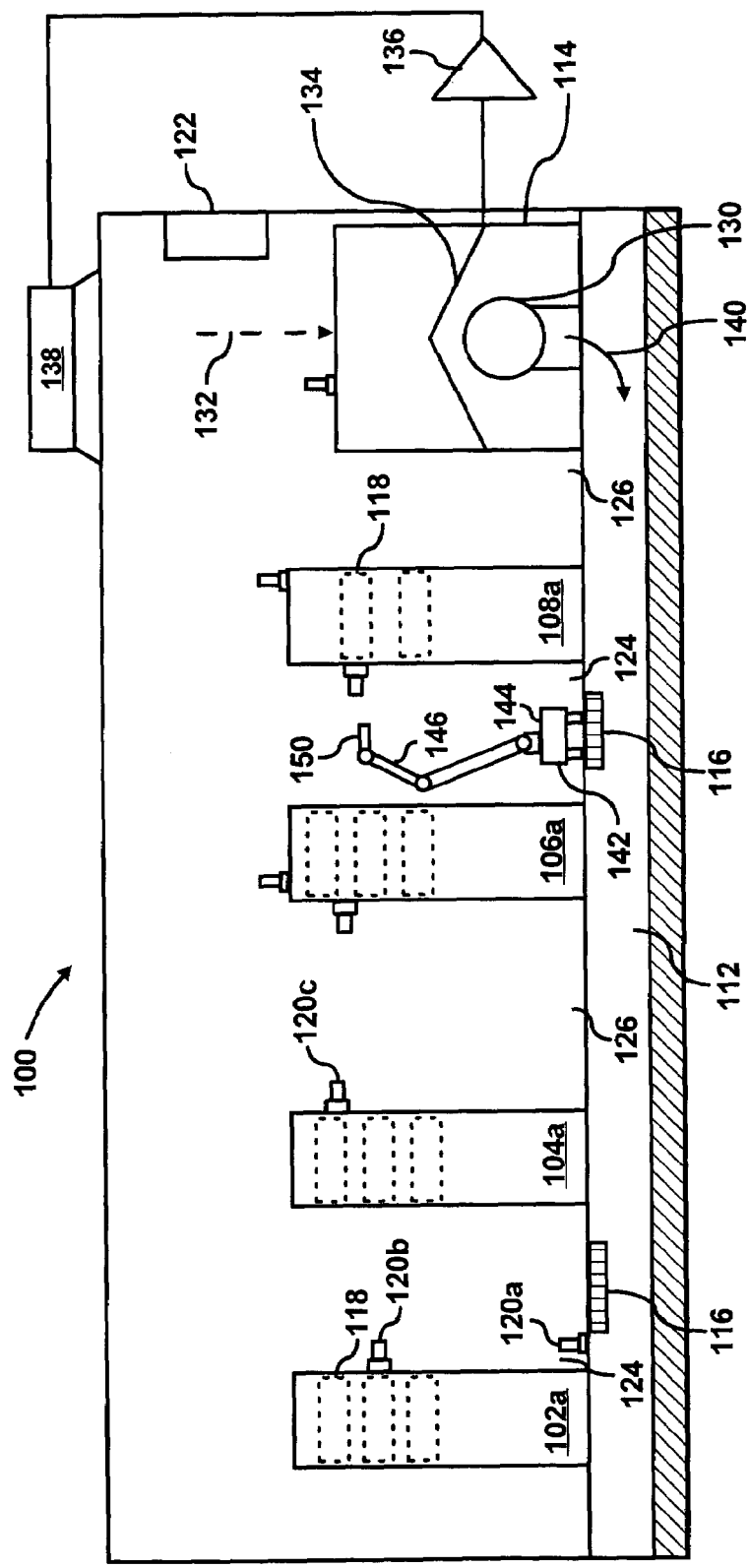
FIG. 1B shows a simplified illustration of a side elevational view of the data center shown in FIG. 1A, according to an embodiment of the invention.

With reference now to FIG. 1B, there is shown a simplified illustration of a side elevational view of the data center 100 shown in FIG. 1A, according to an embodiment of the invention. In FIG. 1B, racks 102a, 104a, 106a, and 108a are visible. In addition, some of the components 118 are visible in cross-section through the sides of the racks 102a, 104a, 106a, and 108a. A more detailed description of the embodiments illustrated with respect to FIG. 1B may be found in co-pending and commonly assigned U.S. application Ser. No. 09/970,707, filed on Oct. 5, 2001, which is hereby incorporated by reference in its entirety.

As shown in FIG. 1B, the areas between the racks 102 and 104 and between the racks 106 and 108 may comprise cool aisles 124. These aisles are considered "cool aisles" because they are configured to receive cooling fluid from the vents 116. In addition, the racks 102–108 generally receive cooling fluid from the cool aisles 124. The aisles between the racks 104 and 106, and on the rear sides of racks 102 and 108, are considered hot aisles 126. These aisles are considered "hot aisles" because they are positioned to receive air heated by the components 118 in the racks 102–108.

The sides of the racks 102–108 that face the cool aisles 124 may be considered as the fronts of the racks 102–108 and the sides of the racks 102–108 that face away from the cool aisles 124 may be considered as the rears of the racks 102–108. For purposes of simplicity and not of limitation, this nomenclature will be relied upon throughout the present disclosure to describe the various sides of the racks 102–108.

As described hereinabove, the air conditioning unit 114 receives and cools heated cooling fluid. In addition, the air conditioning unit 114 supplies the racks 102–108 with air that has been cooled, e.g., cooling fluid, through, for example, a process as described below. The air conditioning unit 114 generally includes a fan 130 for supplying cooling fluid (e.g., air) into the space 112 (e.g., plenum) and/or drawing air from the data center 100 (e.g., as indicated by the arrow 132). In operation, the heated cooling fluid enters into the air conditioning unit 114 as indicated by the arrow 132 and is cooled by operation of a cooling coil 134, a compressor 136, and a condenser 138, in a manner generally known to those of ordinary skill in the art. In terms of cooling system efficiency, it is generally desirable that the return air is composed of the relatively warmest portion of air in the data center 100.

Although reference is made throughout the present disclosure of the use of a fan 130 to draw heated cooling fluid from the data center 100, it should be understood that any other reasonably suitable manner of air removal may be implemented without departing from the scope of the invention. By way of example, a fan (not shown) separate from the fan 130 or a blower may be utilized to draw air from the data center 100.

In addition, based upon the cooling fluid needed to cool the heat loads in the racks 102–108, the air conditioning unit 114 may be operated at various levels. For example, the capacity (e.g., the amount of work exerted on the refrigerant) of the compressor 136 and/or the speed of the fan 130 may be modified to thereby control the temperature and the amount of cooling fluid flow delivered to the racks 102–108. In this respect, the compressor 136 may comprise a variable capacity compressor and the fan 130 may comprise a variable speed fan. The compressor 136 may thus be controlled to either increase or decrease the mass flow rate of a refrigerant therethrough.

Because the specific type of compressor 136 and fan 130 to be employed with embodiments of the invention may vary according to individual needs, the invention is not limited to any specific type of compressor or fan. Instead, any reasonably suitable type of compressor 136 and fan 130 capable of accomplishing certain aspects of the invention may be employed with embodiments of the invention. The choice of compressor 136 and fan 130 may therefore depend upon a plurality of factors, e.g., cooling requirements, costs, operating expenses, etc.

It should be understood by one of ordinary skill in the art that embodiments of the invention may be operated with constant speed compressors and/or constant speed fans. In one respect, control of cooling fluid delivery to the racks 102–108 may be effectuated based upon the pressure of the cooling fluid in the space 112. According to this embodiment, the pressure within the space 112 may be controlled through operation of, for example, a plurality of vents 116 positioned at various locations in the data center 100. That is, the pressure within the space 112 may be kept essentially constant throughout the space 112 by selectively controlling the output of cooling fluid through the vents 116. By way of example, if the pressure of the cooling fluid in one location of the space 112 exceeds a predetermined level, a vent located substantially near that location may be caused to enable greater cooling fluid flow therethrough to thereby decrease the pressure in that location. A more detailed description of this embodiment may be found in U.S. application Ser. No. 10/303,761, filed on Nov. 26, 2002 and U.S. application Ser. No. 10/351,427, filed on Jan. 27, 2003, which are assigned to the assignee of the present invention and are hereby incorporated by reference in their entireties.

In addition, or as an alternative to the compressor 136, a heat exchanger (not shown) may be implemented in the air conditioning unit 114 to cool the fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 130 into the space 112 as indicated by the arrow 140. The cooling fluid flows out of the raised floor 110 and into various areas of the racks 102–108 through the plurality of vents 116. The vents 116 may comprise the dynamically controllable vents disclosed and described in co-pending U.S. application Ser. No. 09/970,707. As described in that application, the vents 116 are termed "dynamically controllable" because they generally operate to control at least one of velocity, volume flow rate and direction of the cooling fluid therethrough. In addition, specific examples of dynamically controllable vents 116 may be found in co-pending U.S. application Ser. No. 10/375,003, filed on Feb. 28, 2003, which is assigned to the assignee of the present invention and is incorporated by reference herein in its entirety.

As the cooling fluid flows out of the vents 116, the cooling fluid may flow into the racks 102–108. The racks 102–108 generally include inlets (not shown) on their front sides to receive the cooling fluid from the vents 116. The inlets generally comprise one or more openings to enable the cooling fluid to enter the racks 102–108. In addition, or alternatively, the front sides of some or all of the racks 102–108 may comprise devices for substantially controlling the flow of cooling fluid into the racks 102–108. Examples of suitable devices are described in co-pending and commonly assigned U.S. patent application Ser. Nos., 10/425,621 and 10/425,624, both of which were filed on Apr. 30, 2003, the disclosures of which are hereby incorporated by reference in their entireties.

The cooling fluid may become heated by absorbing heat dissipated from the components 118 located in the racks 102–108 as it flows through and around the racks 102–108. The heated cooling fluid may generally exit the racks 102–108 through one or more outlets located on the rear sides of the racks 102–108. In addition, or alternatively, the rear sides of some or all of the racks 102–108 may comprise devices for substantially controlling the flow of cooling fluid into the racks 102–108 and/or controlling the flow of heated cooling fluid out of the racks 102–108. Again, examples of suitable devices are described in co-pending and commonly assigned U.S. patent application Ser. Nos., 10/425,621 and 10/425,624.

The flow of air through the racks 102–108 may substantially be balanced with the flow of air through the vents 116 through operation of the above-described devices in manners consistent with those manners set forth in the above-identified co-pending applications. In addition, a proportional relationship may be effectuated between the airflow through the racks 102–108 and the vents 116. By virtue of controlling the airflow in the manners described in those co-pending applications, the level of re-circulation between the heated cooling fluid flow and the cooling fluid may substantially be reduced or eliminated in comparison with known cooling systems.

The air conditioning unit 114 may vary the amount of cooling fluid supplied to the racks 102–108 as the cooling requirements vary according to the heat loads in the racks 102–108, along with the subsequent variations in the volume flow rate of the cooling fluid. As an example, if the heat loads in the racks 102–108 generally increases, the air conditioning unit 114 may operate to increase one or more of the supply and temperature of the cooling fluid. Alternatively, if the heat loads in the racks 102–108 generally decreases, the air conditioning unit 114 may operate to decrease one or more of the supply and temperature of the cooling fluid. In this regard, the amount of energy utilized by the air conditioning unit 114 to generally maintain the components in the data center 100 within predetermined operating temperature ranges may substantially be optimized.

As an alternative, there may arise situations where the additional cooling fluid flow to the racks 102–108 causes the temperatures of the components to rise. This may occur, for example, when a relatively large amount of heated cooling fluid is re-circulated into the cooling fluid. In this situation, cooling fluid delivery may be reduced in response to increased component temperatures. In addition, cooling fluid delivery may be increased in response to decreased component temperatures. It should therefore be understood that the present invention is not limited to one operational manner as temperatures in the data center 100 vary.

Through operation of the vents 116, the above-described devices, and the air conditioning unit 114, global and zonal control of the cooling fluid flow and temperature may substantially be achieved. For instance, the vents 116 and the above-described devices generally provide localized or zonal control of the cooling fluid flow to the racks 102–108. In addition, the air conditioning unit 114 generally provides global control of the cooling fluid flow and temperature throughout various portions of the data center 100. By virtue of the zonal and global control of the cooling fluid, the amount of energy consumed by the air conditioning unit 114 in maintaining the components of the racks 102–108 within predetermined operating temperature ranges may substantially be reduced in comparison with conventional data center cooling systems.

As described hereinabove, the sensors 120 may be implemented to detect one or more environmental conditions, e.g., temperature, pressure, humidity, etc., at various locations throughout the data center 100. By way of example, a sensor 120a may be positioned to detect the temperature of the cooling fluid exhausting from a vent tile 116.

As another example, a sensor 120b may be positioned to detect the temperature of cooling fluid entering into the rack 102a. As a further example, a sensor 120b may be positioned to detect environmental condition(s) at the exhaust of the rack 104a. FIG. 1B illustrates some of the possible locations where the sensors 120 may be positioned throughout the data center 100. It should however be understood that the locations of the sensors 120 illustrated in FIG. 1B are for illustrative purposes only and are not meant to limit the invention. Instead, it should be understood that the sensors 120 may be positioned at any reasonably suitable location where the environmental condition(s) are desired to be measured. In addition, the sensors 120 may be positioned to detect environmental conditions at one or more of the components 118.

Also illustrated in FIG. 1B is a robotic device 142 configured to traverse the data center 100 and to collect environmental condition information. The robotic device 142 may comprise a configuration and operate in manners similar to those described in co-pending and commonly assigned U.S. patent application Ser. No. 10/446,867 filed on May 29, 2003, and entitled "DATA CENTER ROBOTIC DEVICE". The disclosure contained in that application is hereby incorporated by reference in its entirety.

In one respect, the robotic device 142 is generally composed of a vehicle base 144 having a plurality of wheels to enable travel of the robotic device 142 through the data center 100. Attached to the vehicle base 144 is an arm 146 designed to rotate and be maneuvered into various positions with respect to the vehicle base 144, for example, with six or more degrees of freedom. Attached at a free end of the arm 146 is a sensor 150 designed to detect the one or more environmental conditions. The sensor 150 may also be movable with respect to the arm 146, for example, with four or more degrees of freedom.

The arm 146 and the sensor 150 may thus be maneuvered into various positions to gather environmental condition information from areas around the robotic device 142. More particularly, the sensor 150 may be articulated into various positions such that environmental conditions may be gathered around the robotic device 142 without requiring that the vehicle base 144 also be re-positioned. In one regard, the detection of the environmental conditions in this manner may conserve the amount of energy stored in the robotic device 142.

Although the arm 146 of the robotic device 142 has been described as being movable, the arm 146 may be relatively static with respect to the vehicle base 144 without departing from the scope of the invention. In addition, the robotic device 142 may be configured without an arm or with a retractable arm.

FIG. 1C is a cross-sectional side view of an upper portion of the data center 100 according to an embodiment of the invention. According to this embodiment, the data center 100 may include a lowered ceiling 162. Dynamically controllable returns 164 and 166 may be situated along the lowered ceiling 162 to generally enable controlled removal of heated cooling fluid from the data center 100. To facilitate removal of heated cooling fluid from the data center 100, the returns 164 and 166 may include a fan 170. A more detailed description of the returns 164 and 166 and manners of their operability may be found in co-pending U.S. application Ser. No. 10/262,879, filed on Oct. 3, 2002, which is assigned to the assignee of the present invention and is hereby incorporated by reference in its entirety.

As described in the Ser. No. 10/262,879 application, the space 168 between the lowered ceiling 162 and the ceiling of the data center 100 may function as a plenum through which heated cooling fluid may be returned to the air conditioning unit 114.

Sensors 120*d* and 120*e* may be located in the respective vicinities of the returns 164 and 166. In this regard, the sensors 120*d* and 120*e* may be positioned to detect one or more environmental conditions in the vicinities of the returns 164 and 166. This information may be transmitted to the energy manager 122 and utilized in the operational control of the returns 164 and 166 as described in the Ser. No. 10/262,879 application.

FIG. 1D is a cross-sectional side view of an upper portion of the data center 100 according to a further embodiment of the invention. According to this embodiment, heat exchanger units ("HEU") 172 and 174 may be provided in the data center 100. The HEU's 172 and 174 are disclosed and described in co-pending U.S. application Ser. No. 10/210,040, filed on Aug. 2, 2002, which is assigned to the assignee of the present invention and is hereby incorporated by reference in its entirety. As described in the Ser. No. 10/210,040 application, the HEU's 172 and 174 generally operate to receive heated cooling fluid from the racks 102–108, cool the received air, and deliver the cooled air back to the racks 102–108 in a substantially controlled manner.

As also illustrated in FIG. 1D, sensors 120*f* and 120*g* are illustrated in the vicinities of the HEU's 172 and 174. In this regard, the sensors 120*f* and 120*g* may be positioned to detect one or more environmental conditions in the vicinities of the HEU's 172 and 174. The environmental conditions detected by the sensors 120*f* and 120*g* may be transmitted to the energy manager 122 and utilized in the operational control of the HEU's 172 and 174 as described in the Ser. No. 10/210,040 application.

Figure 2:
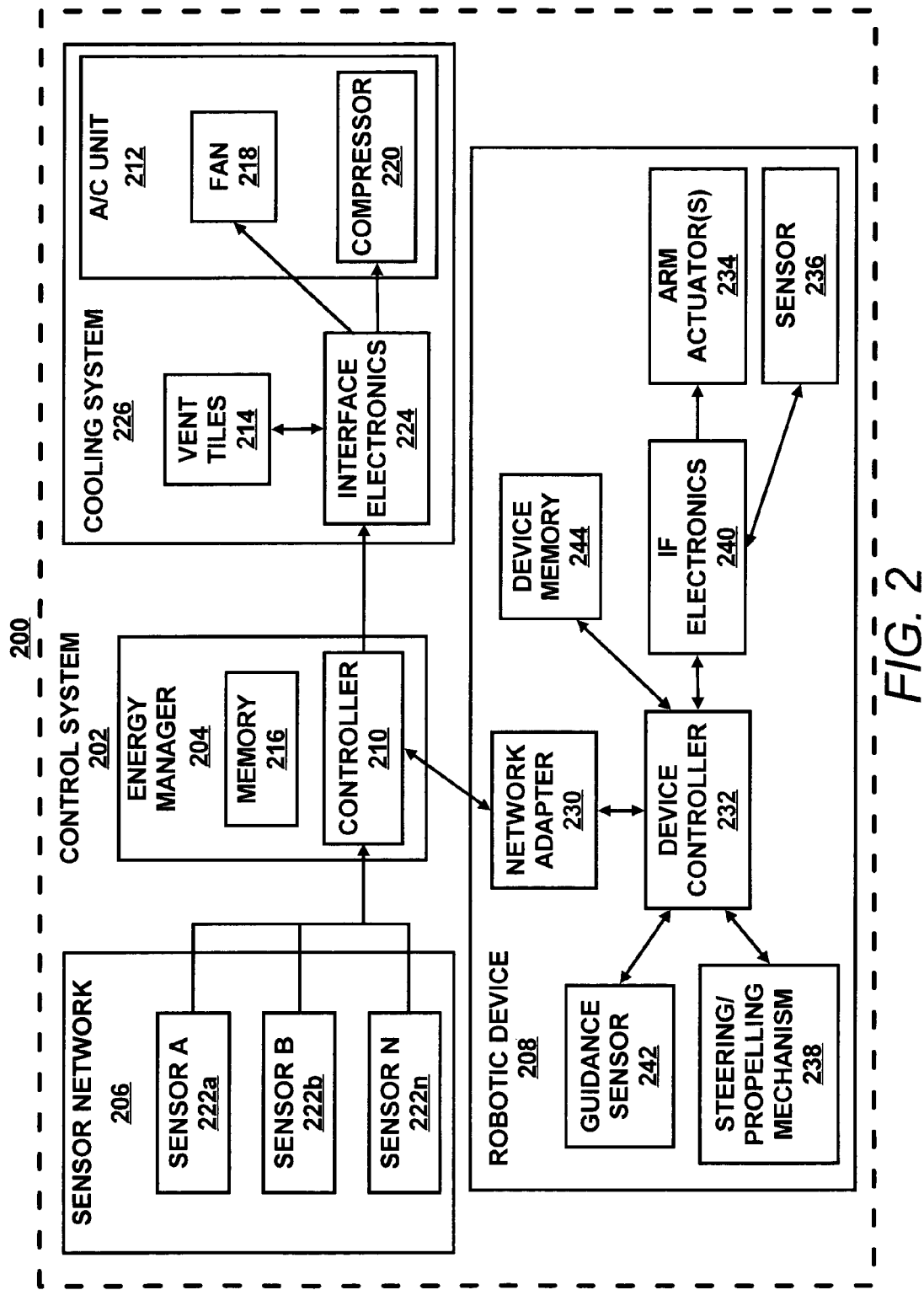
FIG. 2 is an exemplary block diagram of a control system according to an embodiment of the invention.

FIG. 2 is an exemplary block diagram 200 of a control system 202 according to an embodiment of the invention. It should be understood that the following description of the block diagram 200 is but one manner of a variety of different manners in which such a control system may be configured. In addition, it should be understood that the block diagram 200 may include additional components and that some of the components described herein may be removed and/or modified without departing from the scope of the invention.

The control system 202 includes an energy manager 204, e.g., energy manager 122, designed to receive environmental condition information from a sensor network 206. The energy manager 204 is also configured to communicate with a cooling system 226 and a robotic device 208. The energy manager 204 includes a controller 210 configured to control the operations of the cooling system 226 and to communicate with the robotic device 208. In one regard, the controller 210 may control operations of an air conditioning unit 212, e.g., air conditioning unit 114, and/or vent tiles 214, e.g., vent tiles 116. The controller 210 may comprise a microprocessor, a micro-controller, an application specific integrated circuit (ASIC), and the like.

The controller 210 may be interfaced with a memory 216 configured to provide storage of a computer software that provides the functionality of the energy manager 204. The memory 216 may be implemented as a combination of volatile and non-volatile memory, such as DRAM, EEPROM, flash memory, and the like. The memory 216 may also be configured to provide a storage for containing data/information pertaining to the manner in which the air conditioning unit 212 and/or the vent tiles 214 may be operated in response to, for example, changing environmental conditions in the data center 100.

In one respect, the memory 216 may store data/information pertaining to the manner in which one or both of the fan 218 and the compressor 220 of the air conditioning unit are to operate in response to conditions detected by the sensor network 306. In another respect, the memory 216 may store the environmental condition information received from the sensor network 206. In addition, the memory 216 may store the locations of the sensors 222*a*–222*n*, e.g., sensors 120, of the sensor network 206.

The instructions from the controller 210 may be transmitted to the cooling system 226 through interface electronics 224. The interface electronics 224 may be provided to act as an interface between the controller 210 and the air conditioning unit 212 and the vent tiles 214. By way of example, the interface electronics 224 may vary the voltage supplied to the fan 218 to vary the airflow out of the air conditioning unit 212.

The controller 210 may be interfaced with the robotic device 208 through a network adapter 230. The network adapter 230 may be configured to enable wired or wireless communication between the controller 210 and the robotic device 208. In one regard, the robotic device 208 may receive data and/or instructions from the controller 210 and may also transmit data to the controller 210. Communications between the controller 210 and the robotic device 208 may be effectuated through a wired protocol, such as IEEE 802.3, etc., or wireless protocols, such as IEEE 801.11b, 801.11g, wireless serial connection, Bluetooth, etc., or combinations thereof.

Although a single robotic device 208 is illustrated in FIG. 2 as communicating with the energy manager 204, it should be understood that a plurality of robotic devices 208 may communicate with the energy manager 204 without departing from the scope of the invention. If a plurality of robotic devices 208 are employed, the energy manager 204 may compile the received information in a readily accessible form such that the environmental conditions throughout the data center may be relatively easily determined.

The robotic device 208 may comprise the configuration of the robotic device 142 illustrated in FIG. 1B. Thus, the robotic device 208 may include arm actuator(s) 234 for articulating an arm assembly into various positions. The robotic device also includes a sensor 236 configured to detect one or more environmental conditions.

The robotic device 208 includes a device controller 232 configured to control the operations of the robotic device 208. By way of example, the device controller 232 may control the arm actuator(s) 234, the sensor 236, and a steering/propelling mechanism 238. The device controller 232 may thus comprise a microprocessor, a micro-controller, an application specific integrated circuit (ASIC), and the like.

As stated hereinabove, the sensor 236 may be positioned near a free end of the arm assembly and its position may be varied through movement of the arm assembly. In one regard, the position of the sensor 236 may be varied to enable the sensor 236 to obtain environmental condition information various locations of the data center 100.

Although not shown, the one or more actuators may be included for articulating the sensor 236 with respect to the robotic device 208. In any respect, the arm actuator(s) 234 and the actuators of the sensor 236 may comprise direct current (DC) motors.

The instructions from the device controller 232 may be sent through interface electronics 240. The interface electronics 240 may be provided to act as an interface between the controller 232 and the arm actuator(s) 234 and the sensor 236. By way of example, the interface electronics 240 may vary the voltage supplied to the arm actuator(s) 234 to thereby articulate the sensor 236 into various positions.

The steering/propelling mechanism 238 may be configured to control the motivation and direction of travel for the robotic device 208. The steering/propelling mechanism 238 may thus comprise actuators configured to vary these aspects of the robotic device 208 travel. The device controller 232 may also receive information from a guidance sensor 242, e.g., a laser guidance tool, sonar tool, a camera assembly, combinations thereof, and the like, configured to detect the distances of objects located within the field of view of the guidance sensor 242. The received information may be in the form of detected positions of objects located around the robotic device 208.

The device controller 232 may process the images, e.g., with image recognition software. In this regard, the device controller 232 may determine the objects located within the guidance sensor's 242 field of view, whether the object is an avoidable obstacle, and determine a path around the obstacle if it is avoidable. The information obtained by the guidance sensor 242 may also be implemented to operated the steering/propelling mechanism 238. By way of example, the steering/propelling mechanism 238 may be caused to decrease speed and alter its course in response to an object being detected in the path of the robotic device 208.

In addition, or in the alternative, the information obtained by the guidance sensor 242 may be transmitted or otherwise sent to a user who may operate the robotic device 208 to avoid, for example, objects located in the path of the robotic device 208.

The device controller 232 may also be interfaced with a device memory 244 configured to provide storage of a computer software that provides the functionality of the robotic device 208. The memory 244 may be implemented as a combination of volatile and non-volatile memory, such as DRAM, EEPROM, flash memory, and the like. The memory 244 may also be configured to provide a storage for containing data/information pertaining to the manner in which the arm actuator(s) 234 and the sensor 236 may be operated in response to, for example, an instruction to obtain environmental condition information from various locations in the data center.

In one respect, the device memory 244 may store data/ information pertaining to various operations and sensing algorithms responsive to various inputs. For example, the device memory 244 may store a map of the data center layout and the device controller 232 may access the map to determine the locations of areas where environmental conditions have been detected as being out of range. The device controller 244 may also access the map to determine a route to follow to arrive at the locations.

In addition, the device controller 232 may access the device memory 244 to determine manners in which the sensor 236 is to be operated in response to receipt of various inputs. For example, the device controller 236 may operate the sensor 236 and the arm actuator(s) 234 to obtain environmental condition information from areas, e.g., within four feet of the robotic device 208, surrounding the detected locations of out-of-range environmental conditions.

The sensor 236 may transmit or otherwise send the obtained information to the device controller 232. The device controller 232 may store this information in the memory 244. For instance, the memory 244 may store temperature measurements obtained during an environmental condition detection operation along with the locations of the detections. The device memory 244 may store this information in the form of a table, map, etc.

The device controller 232 is operable to transmit or otherwise send data to the controller 210. The device controller 232 may be configured to substantially continuously communicate with the controller 210. For instance, the network adapter 230 may comprise a wireless communication device configured to enable wireless communications between the controller 210 and the robotic device 208. In addition, or in the alternative, the device controller 232 may form a wired connection between itself and the controller 210 at various instances. For example, the robotic device 208 may be instructed to travel to the location of the energy manager 122, form a wired connection between the device controller 232 and the controller 210 to enable data transfer therebetween.

As stated hereinabove, the sensor network 206 is composed of a plurality of sensors 222a–222n. Three sensors 222a–222n are shown for purposes of simplicity and not of limitation. In this regard, it should understood that the control system 202 may include any number of sensors without departing from the scope of the invention. The sensors 222a–222n may comprise any reasonably suitable sensor configured to detect one or more environmental conditions.

As an alternative to conventional sensors, the sensors 222a–222n may comprise the configuration and operability of the detecting devices discussed and described in co-pending U.S. patent application Ser. No. 10/628,369 filed on, and entitled "ENVIRONMENTAL CONDITION MEASUREMENT SYSTEM". The disclosure of that application is hereby incorporated by reference in its entirety. As described in that application, the sensors 222a–222n may comprise relatively simple configurations and may be imaged by reader devices. The images may be utilized to determine the environmental conditions detected by the sensors 222a–222n.

In any respect, the energy manager 204, and more particularly, the controller 210, may operate to classify the environmental conditions detected by the sensors 222a–222n into various categories. The classifications may include any number of categories. However, for purposes of simplicity of description, only two categories will be described hereinbelow. The first category may contain those locations, e.g., racks, components, etc., having environmental conditions above predetermined ranges e.g., nominal operating ranges. For instance, if the detected environmental condition is temperature, and the predetermined range is 20–24° C., the first category may contain locations where the temperature measurements are above 30° C. The second category may contain those locations having environmental conditions that are in a warning zone, e.g., having environmental conditions that are relatively close to the first category. In keeping with the above example, the second category may contain locations where the temperature measurements are between 25–29° C.

The determination of the set points for the first category and the second category conditions may be set according to a variety of factors. For instance, the set points may be determined according to the level of safety desired in the data center. Thus, the set points may be set lower for greater safety. In addition, the set points may be determined during the installation and programming of the cooling system provisioning.

The predetermined ranges may be defined, for example, as predetermined ranges of operating temperatures for the components 118, e.g., between a maximum set point temperature ($T_{max,set}$) and a minimum set point temperature ($T_{min,set}$). In general, the range of temperatures between $T_{min,set}$ and $T_{max,set}$ pertains to threshold temperatures that the controller may use to determine whether to increase or decrease the flow of cooling fluid delivered to the components. This range of operating temperatures may be set according to a plurality of factors. These factors may include, for example, the operating temperatures set forth by the manufacturers of the components, through testing to determine the optimal operating temperatures, etc. In addition, the predetermined range of operating temperatures may vary from one component to another.

The controller 210 may store the categorized conditions in the memory 216. The controller 210 may also rank-order the first category conditions according to their deviation from the predetermined ranges. Thus, for instance, the controller 210 may rank the first category conditions having the greatest deviation, either above or below the predetermined ranges, as having the highest rankings. In addition, the controller 210 may rank the first category conditions having the smallest deviation, either above or below the predetermined ranges, as having the lowest rankings. The controller 210 may also perform a similar type of rank-ordering operation on the second category conditions.

The controller 210 may transmit the categorized condition information, including the rank-orderings of the first and second categories, and their locations, to the robotic device 208. The robotic device 208 may store this information in the device memory 244. In addition, the device controller 232 may determine a route to travel based upon the location information and rank-ordering of the first category locations. In one respect, the device controller 232 may determine a route to the highest ranking first category location and cause the robotic device 208 travel to that location. In addition, or in the alternative, the device controller 232 may determine the location of the first category location that is the closest to position of the robotic device 208.

According to an embodiment of the invention, the sensors 222a–222n and the robotic device 208 may comprise the location aware devices described hereinabove and in co-pending and commonly assigned U.S. patent application Ser. No. 10/620,272, filed on Jul. 9, 2003, entitled "LOCATION AWARE DEVICES". As described in that application, these devices are termed "location aware" because they are operable to determine their general locations with respect to other sensors and/or devices and to communicate with one another through wireless communications. Through use of location aware devices as described in that application, the device controller 232 may determine its location with respect to the sensors 222a–222n. In addition, the use of these location aware devices may enable wireless communication between the device controller 232 and the controller 210.

Figure 3:
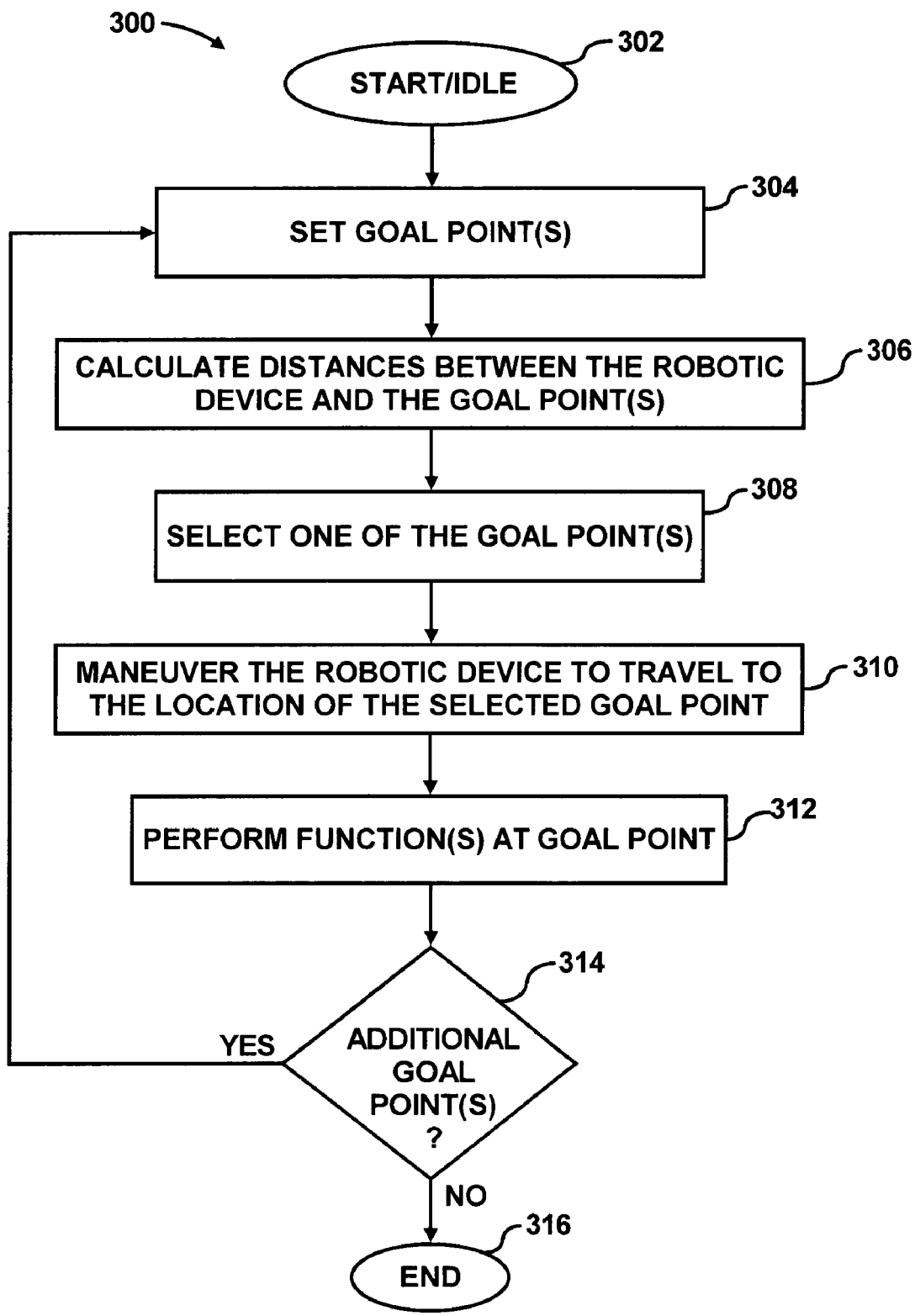
FIG. 3 illustrates an exemplary flow diagram of an operational mode of a method for operating a robotic device according to an embodiment of the invention.

FIG. 3 illustrates an exemplary flow diagram of an operational mode 300 of a method for operating a robotic device 208 according to an embodiment of the invention. It is to be understood that the following description of the operational mode 300 is but one manner of a variety of different manners in which an embodiment of the invention may be practiced. It should also be apparent to those of ordinary skill in the art that the operational mode 300 represents a generalized illustration and that other steps may be added or existing steps may be removed, modified or rearranged without departing from the scope of the invention.

The description of the operational mode 300 is made with reference to the block diagram 200 illustrated in FIG. 2, and thus makes reference to the elements cited therein. It should, however, be understood that the operational mode 300 is not limited to the elements set forth in the block diagram 200. Instead, it should be understood that the operational mode 300 may be practiced by a control system having a different configuration than that set forth in the block diagram 200.

The operational mode 300 may be initiated in response to a variety of stimuli at step 302. For example, the operational mode 300 may be initiated in response to a predetermined lapse of time, in response to receipt of a transmitted signal, manually initiated, etc. Once initiated, the robotic device 208, and more particularly, the device controller 232 may set one or more goal points at step 304. The one or more goal points may be set according to a variety of factors. For instance, the one or more goal points may be set to enable the robotic vehicle 208 to provide the maximum spatial coverage of the data center in the minimal amount of time. Any number of routing algorithms may be implemented to accomplish this type of operation of the robotic vehicle 208, e.g., Manhattan algorithm, etc. As another example, the one or more goal points may be set according to navigable pathways in the data center. Additional embodiments of manners in which the one or more goal points may be set are described in detail hereinbelow with respect to FIGS. 4A–4C.

At step 306, the device controller 232 may calculate the distances between the robotic device 208 and the one or more goal points. The distance calculation may be performed, for example, by comparing coordinate locations of the one or more goal points and the coordinate location of the robotic device 208 on a map stored in the device memory 244. In this respect, the robotic device 208 may be capable of determining its location on the map. In addition, the device controller 232 may determine the amount of travel time required to reach the one or more goal points. This determination may be made through knowledge of navigable pathways available for the robotic device 208 to access in reaching the one or more goal points. In this regard, the robotic device may be programmed with all of the navigable pathways and whether any of those pathways are impeded.

The device controller 232 may select for travel by the robotic device 208, one of the one or more goal points at step 308. The device controller 232 may select the one goal point according to a variety of factors. For instance, the device controller 232 may select the goal point that is the closest to the robotic device 208 when the operational mode 300 is initiated. In addition, the device controller 232 may select the goal point that requires the least amount of travel time instead of the closest goal point. As another example, the device controller 232 may select the goal point requiring the most immediate attention, e.g., the goal point with the highest temperature. Moreover, the device controller 232 may perform a calculation that weighs the distance and the level of attention required and selects the goal point based on the outcome of that calculation. Thus, for example, the selected goal point may comprise a goal point that is neither nearest to the robotic device 208 nor requires the most immediate attention.

At step 310, the device controller 232 may maneuver the robotic device 208 to travel to the location of the selected goal point. The manner of travel to the selected goal point may be based on one or more algorithms designed to minimize the travel time between the robotic device's 208 original position and the goal point location. This may involve a determination of the shortest unimpeded pathway, for example.

The robotic device 208 may be configured to perform one or more functions at the selected goal point, as indicated at step 312. The robotic device 208 may be configured to perform various functions at the selected goal point according to its programming and configuration. For instance, the robotic device 208 may be programmed and configured to detect one or more environmental conditions in the areas around the selected goal point. As another example, the robotic device 208 may be programmed and configured to re-position various objects, e.g., objects that may be impeding delivery of cooling fluid from the vent tiles 116. A more detailed description of manners in which the robotic device 208 may be operated may be found in co-pending U.S. patent application Ser. No. 10/446,867.

The robotic device 208 may be configured with a camera (not shown) designed to obtain images around the robotic device 208. At step 312, the robotic device 208 may be configured to obtain one or more images of racks located around the selected one of the one or more goal points. The images obtained by the robotic device 208 may be employed to determine whether any changes to the configuration of the racks have occurred. For instance, the images may be used to determine whether previously open spaces have been filled with new components or if existing components have been removed. In this regard, the operational mode 300 may be employed as a manner of maintaining an inventory of the components 118 housed in the data center 100.

As another example, at step 304, one or more of the goal points may include one or more air conditioning units. At step 312, the robotic device 208 may be configured to image the one or more air conditioning units. These images may be employed to determine whether the air conditioning unit(s) are operating properly. For instance, the air condition unit(s) may contain warning signals that the robotic device 208 may be configured to image.

At step 314, the device controller 232 may determine whether there are additional goal points. If additional goal points exist, the device controller 232 may repeat steps 306–314. In addition or in the alternative, at step 308, the device controller 232 may select a path or an order in which the robotic device 208 is to travel to each of the plurality of goal points. The selection of the path may again be based upon an algorithm designed to maximize spatial coverage with minimal time.

If no additional goal points exist, the operational mode 300 may end as indicated at step 316. Step 316 may be equivalent to an idle mode since steps 304–314 may be repeated, e.g., in response to a manual instruction, at a predetermined time, etc. In addition, during this time, the robotic device 208 may be maneuvered to a base station where it may re-charge, download information, receive instructions, etc.

According to another embodiment of the invention, the operational modes 300 and 400 may be employed to determine levels of re-circulation and infiltration of heat into the cool aisles 124. This embodiment may be employed, for instance, in data centers that have a limited number of sensors or no sensors configured to detect the cooling fluid flow out of the vent tiles 116.

According to this embodiment, at step 304, the goal points may be set based upon navigable pathways in the data center. For instance, the goal points may include locations around the vent tiles 116 in various cool aisles 124. In addition, the robotic device 208 may be programmed to travel to the desired goal points according to one or more navigational algorithms. For instance, the one or more navigational algorithms may include selecting paths which enable the robotic device 208 to travel based upon coverage of the greatest area of the data center in the minimal amount of time. As another example, the path may be selected to enable the robotic device 208 to obtain environmental condition information around vent tiles 116 associated with particular air conditioning units 114.

Once the temperature measurements are obtained by the robotic device 208, e.g., at step 312, the robotic device 208 may transmit the temperature information to the energy manager 204. The energy manager 204 may use the temperature information to determine the extent of heat infiltration, e.g., supply heat index (SHI). The manner in which the energy manager 204 may determine SHI is described in detail in co-pending U.S. patent application Ser. No. 10/446,854, filed on May 29, 2003, the disclosure of which is hereby incorporated by reference in its entirety. As also discussed in that application, the cooling system components may be manipulated in various respects to compensate for differing SHI levels. In this regard, according to this embodiment of the invention, the energy manager 204 may also manipulate the cooling system 226 to reduce SHI levels in the data center.

The following discussion describes in greater detail, manners in which the robotic device 208 may be operated according to various embodiments of the invention.

Figure 4A:
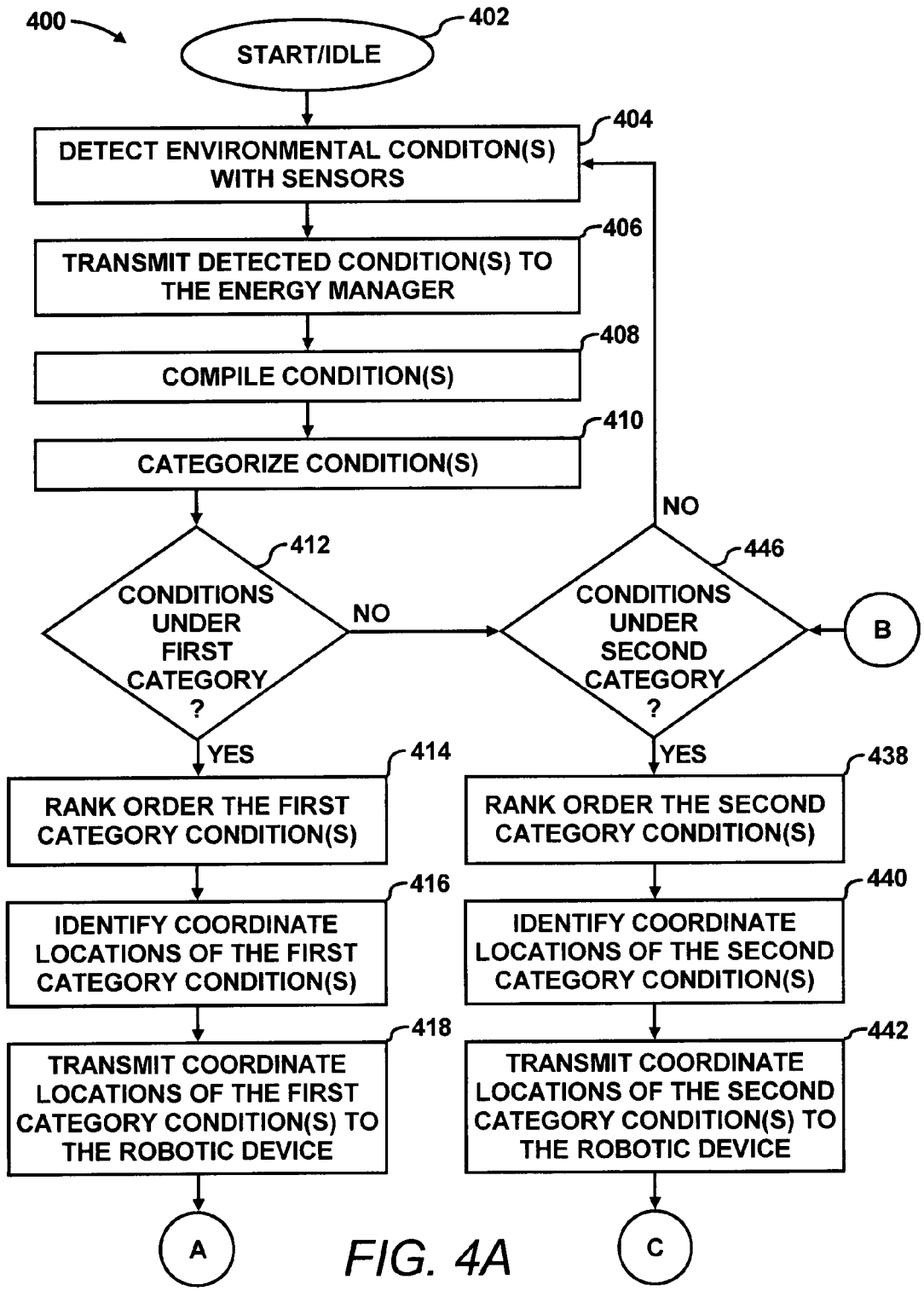
FIGS. 4A–4C, collectively, illustrate an exemplary flow diagram of an operational mode of a method for operating a control system having a robotic device according to an embodiment of the invention.
Figure 4B:
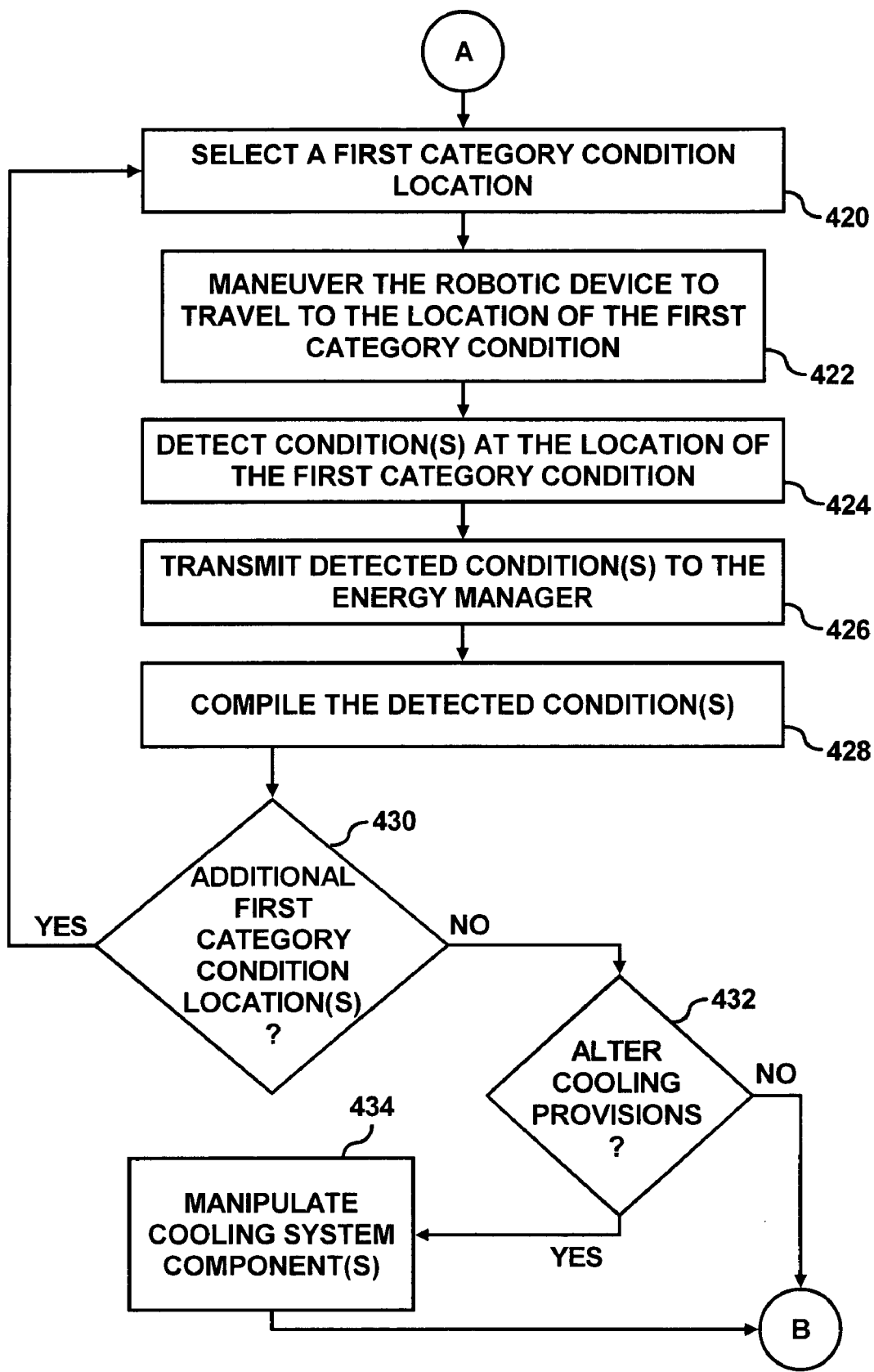
Figure 4C:
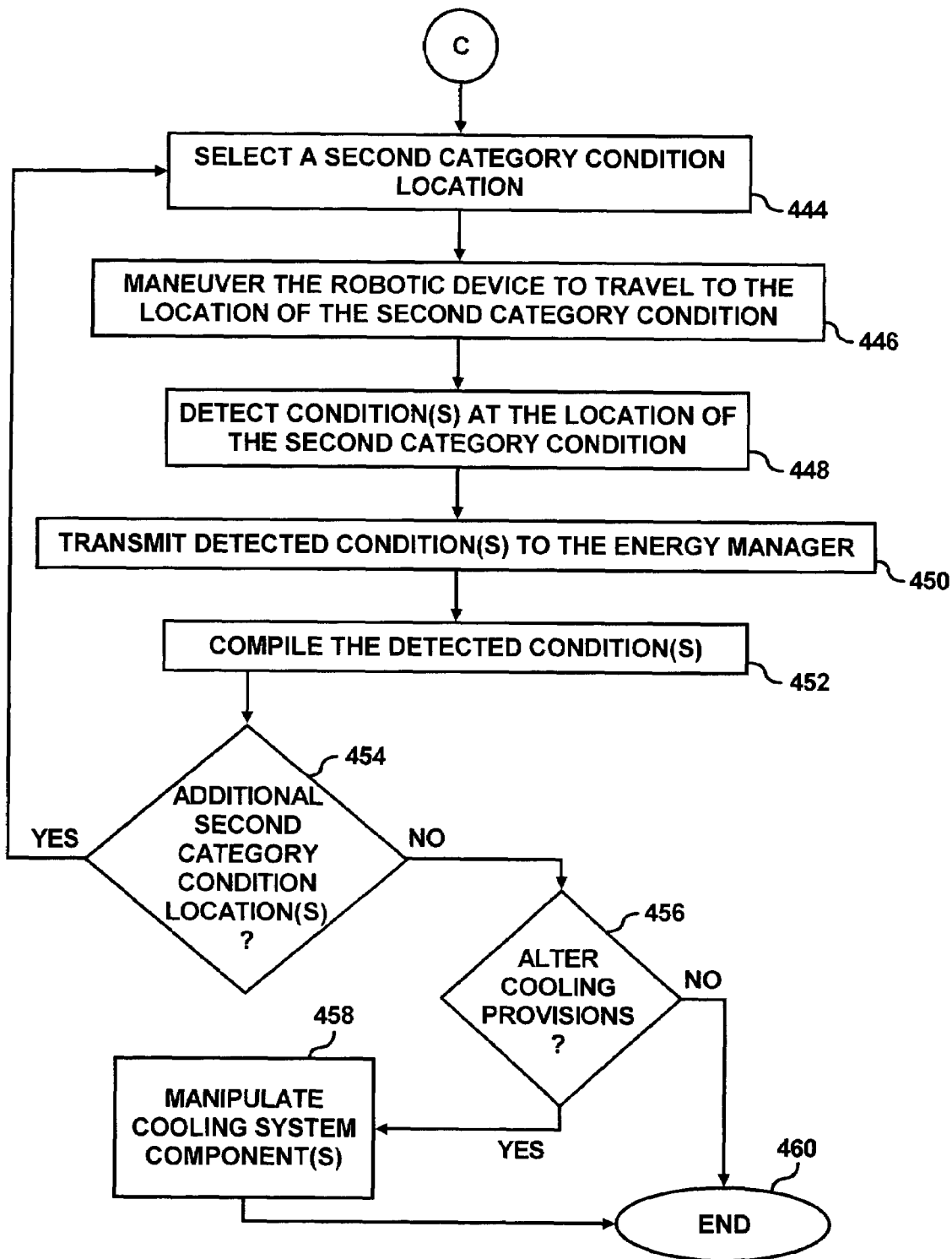

FIGS. 4A–4C, collectively, illustrate an exemplary flow diagram of an operational mode 400 of a method for operating a control system having a robotic device according to an embodiment of the invention. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from the scope of the invention.

The description of the operational mode 400 is made with reference to the block diagram 200 illustrated in FIG. 2, and thus makes reference to the elements cited therein. It should, however, be understood that the operational mode 400 is not limited to the elements set forth in the block diagram 200. Instead, it should be understood that the operational mode 400 may be practiced by a control system having a different configuration than that set forth in the block. diagram 200.

The operational mode 400 may be initiated in response to a variety of stimuli at step 402. For example, the operational mode 400 may be initiated in response to a predetermined lapse of time, in response to receipt of a transmitted signal, manually initiated, etc. At step 404, the sensors 222a–222n may detect one or more environmental conditions. The detected one or more environmental conditions may be transmitted to the energy manager 204, at step 406. The manner of information transmission between the sensors 222a–222n and the energy manager 204 may be effectuated in any of the manners set forth hereinabove.

According to another embodiment of the invention, computational fluid dynamics tools, e.g., FLOVENT from Flomerics of Southborough, Mass., may be employed to provide predictive modeling of temperature, or other environmental condition, distribution in the data center. In this regard, instead of relying upon measurements obtained by sensors in the data center, the computational fluid dynamics tool may be implemented to predict the temperature, or other environmental condition, distribution in the data center. This embodiment may be used, for example, in a data center that has a relatively limited number or no sensors designed to detect environmental conditions. In addition, the robotic device 208 may be implemented to confirm the predicted environmental condition(s).

At step 408, the energy manager 204 may compile the environmental condition(s). In this regard, the energy manager 204, and more particularly the controller 210 may correlate the identities of the sensors 222a–222n with their transmitted environmental condition information. The identities of the sensors 222a–222n may comprise serial numbers assigned by data center personnel, IP addresses, etc. The controller 210 may store the received information in the memory 216. In addition, the controller 210 may classify the received environmental condition information into various categories at step 410.

A first category may comprise those areas of the data center whose environmental condition(s) are approaching critical values. In this regard, the first category may comprise those environmental conditions that exceed a pre-set amount above a predetermined temperature range. The pre-set amount may be selected as a certain level below a failure point for the components in the data center. In addition, the pre-set amount may vary from one component to another depending upon its failure point. Thus, for instance, if the failure point for a component is known to be 35° C., the pre-set amount may be 30° C.

A second category may comprise those areas of the data center whose environmental conditions are in a warning zone. In this regard, the second category may comprise environmental conditions that exceed the predetermined range but fall below the pre-set amount. In keeping with the above-described example, if the maximum value of the predetermined range is 24° C., the second category may comprise those environmental conditions that are between 25–29° C.

A third category may comprise those areas of the data center whose environmental conditions are within or below the predetermined range. The controller 210 may store this information in the memory 216 to track how the environmental conditions in those areas may be changing.

At step 412, the controller 210 may determine whether any conditions falling under the first category exist. If more than one first category conditions exist, the controller 210 may rank-order the first category conditions based upon their deviation from the pre-set amount at step 414. Thus, for instance, the conditions that have the greatest deviation from the pre-set amount will have the highest ranking and so forth.

Based upon, for example, the identities of the sensors 222a–222n, the controller 210 may determine the locations of the first category conditions at step 416. That is, the memory 216 may have stored therein the locations of the sensors 222a–222n along with their associated identities that the controller 210 may access to determine the locations of the first category conditions. The memory 216 may store the location information in the form of coordinate locations, e.g., x, y, and z. In addition, or alternatively, the memory 216 may store the location information of the sensors 222a–222n in terms of their locations with respect to racks or other objects in the data center, e.g., row and column of the racks.

In any respect, the controller 210 may transmit the locations of the first category conditions to the robotic device 208 at step 418. The manner in which communication between the controller 210 and the robotic device 208 may be effectuated is described in detail hereinabove. The locations of the first category conditions may be defined as the goal points for the robotic device 208.

In addition or alternatively, the robotic device 208 may have stored various goal points in the device memory 244. In this case, the energy manager 204 may transmit the locations of the sensors that detect the first category conditions to the robotic device 208. The robotic device 208 may determine the locations of the goal points that are nearest to these sensors. In this regard, the robotic device 208 may travel to the locations of the goal points instead of the locations of the sensors.

At step 420, the device controller 232 may select a goal point for the robotic device 208 to travel. In one respect, the goal point may be selected according to its proximity, e.g., the closest goal point, to the robotic device 208. The device controller 232 may make this determination through a calculation of the distance between the location of the robotic device 208 and the locations of the goal points. In making this comparison, the device controller 232 may access a map stored in the device memory 244.

As described hereinabove, if location aware devices are implemented in the data center, the device controller 232 employ these devices to determine its location with respect to sensors that are configured with location aware devices. In this regard, if location aware devices are employed, the energy manager 204, and more particularly, it may be unnecessary for the controller 210 to update the serial numbers and/or IP addresses of the sensors since the identifications of the sensors will be updated through use of the location aware devices themselves. In addition, or alternatively, the device controller 232 may select a goal point according to its deviation from the pre-set amount, e.g., the goal point with the greatest deviation fro the pre-set amount.

In addition, at step 420, the device controller 232 may calculate the amount of energy required for the robotic device 208 to travel to the nearest goal point. The required energy may be calculated based upon the distance to the nearest goal point. If the device controller 232 determines that the robotic device 208 battery has insufficient energy to travel to the nearest goal point, the device controller 232 may cause the robotic device 208 to travel to a re-charging area (not shown). In addition, the device controller 232 may perform this analysis at various times, for example, at pre-set intervals, when the battery charge falls below a predetermined level, etc.

If the device controller 232 determines that the battery has sufficient charge, the device controller 232 may operate the steering/propelling mechanism 238 to cause the robotic device 208 to travel to the nearest goal point at step 422. Once at the goal point, the device controller 232 may activate the sensor 236 to obtain environmental condition(s) at the goal point at step 424. In addition, the device controller 232 may maneuver the sensor 236 to obtain environmental condition information in areas around the goal point, e.g., within four linear feet of the goal point. The device controller 232 may vary the location of the sensor 236 through operation of the arm actuator(s) 234 and/or through operation of the steering/propelling mechanism 238. In this respect, for instance, the device controller 232 may determine the extent of the environmental condition(s) around the sensors that detected the out-of-range conditions.

The device controller 232 may transmit the detected condition(s) to the energy manager 204 at step 426. The information transmitted to the energy manager from the device controller 232 may include the location of the robotic device 208 as well as the general condition of the goal point. Data transmission may be accomplished in any of the manners set forth hereinabove. The energy manager 232 may compile the received condition information at step 428. That is, for example, the energy manager 232, and more particularly the controller 210 may store the received condition(s) and the locations from which they were detected in the memory 216. In addition, the controller 210 may more accurately determine the state of the environmental conditions in those locations.

In addition, or alternatively, the device controller 232 may transmit information, e.g., robotic device 208 location and conditions sensed, to the energy manager at various times. For instance, the device controller 232 may be in continuous communication with the energy manager 204, at set time intervals, when there is a change in the robotic device 208 location, or when the robotic device 208 senses one or more conditions that are outside of the predetermined value. Thus, for example, if the robotic device 208 detects a substantially high degree of abnormality, e.g., temperature measurements close to failure limits, the robotic device 208 may substantially immediately transmit this information to the energy manager 204. In this regard, if there is a malfunction in the robotic device 208, there is greater likelihood that the energy manager 204 may have the most current information.

As another example, the robotic device 208 may be programmed to store information relating to its location and detected conditions in the device memory 244. In this regard, for instance, the robotic device 208 may compare previously detected conditions with presently detected conditions to determine whether there are inappropriate fluctuations between the conditions. For instance, the robotic device 208 may determine that a relatively rapid increase in temperature has occurred at a location in the data center and transmit this information to the energy manager 204 even if the present temperature is below a predetermined value. In addition, the robotic device 208 may transmit the stored information to the energy manager 204 at set time intervals.

At step 430, the device controller 232 may determine whether there are additional first category condition locations, e.g., additional goal points. If the device controller 232 determines that there are additional goal points, the device controller 232 may perform step 420 and determine the location of the nearest goal point. In addition, the device controller 232 may repeat steps 420–430 for any additional goal points.

According to an embodiment of the invention, the robotic device 208 may travel to any number of goal points and detect the conditions at those locations prior to transmitting the detected conditions to the energy manager at step 426. Thus, for instance, the robotic device 208 may detect conditions at all of the first category condition locations prior to communicating with the energy manager 204.

If there are no further first category condition locations for the robotic device 208 to obtain environmental condition information, the controller 210 may determine whether alterations to the cooling provisions in those locations and/or throughout the data center are warranted at step 432. If the controller 210 determines that changes in the cooling provisions are required, the controller 210 may manipulate the cooling system 226 components at step 434. For instance, the controller 210 may manipulate one or more vent tiles 214 to vary the flow of cooling fluid from one location to another. As another example, the controller 210 may manipulate the air conditioning unit 212 to vary the temperature and/or output of the cooling fluid delivered through the vent tiles 214. Specific examples of manners in which the cooling system 226 may be manipulated are described in greater detail hereinbelow.

It should be appreciated that the manipulation of cooling system components at step 434 may be performed substantially simultaneously with condition detection with the robotic device 208 without departing from the scope of the invention.

If the controller 210 determines that cooling provisions do not require alteration, e.g., the environmental condition(s) have stabilized or are decreasing at the first category locations, at step 432, or after manipulation of the cooling system components at step 434, the controller 210 may determine whether conditions under the second category exists at step 436. If more than one second category conditions exist, the controller 210 may rank-order the second category conditions based upon their deviation from the predetermined range at step 438. Thus, for instance, the conditions that have the greatest deviation from the predetermined range will have the highest ranking and so forth.

Based upon, for example, the identities of the sensors 222a–222n, the controller 210 may determine the locations of the second category conditions at step 440. That is, the memory 204 may have stored therein the locations of the sensors 222a–222n along with their associated identities that the controller 210 may access to determine the locations of the second category conditions. The memory 216 may store the location information in the form of coordinate locations, e.g., x, y, and z. In addition, or alternatively, the memory 216 may store the location information of the sensors 222a–222n in terms of their locations with respect to racks or other objects in the data center, e.g., row and column of the racks.

In any respect, the controller 210 may transmit the locations of the second category conditions to the robotic device 208 at step 442. The manner in which communication between the controller 210 and the robotic device 208 may be effectuated is described in detail hereinabove. The locations of the second category conditions may also be defined as the goal points for the robotic device 208.

In addition or alternatively, the robotic device 208 may have stored various goal points in the device memory 244. In this case, the energy manager 204 may transmit the locations of the sensors that detect the second category conditions to the robotic device 208. The robotic device 208 may determine the locations of the goal points that are nearest to these sensors. In this regard, the robotic device 208 may travel to the locations of the goal points instead of the locations of the sensors.

At step 444, the device controller 232 may select a goal point for the robotic device 208 to travel. In one respect, the goal point may be selected according to its proximity, e.g., the closest goal point, to the robotic device 208. The device controller 232 may make this determination through a calculation of the distance between the location of the robotic device 208 and the locations of the goal points. In making this comparison, the device controller 232 may access a map stored in the device memory 244. As described hereinabove, if location aware devices are implemented in the data center, the device controller 232 employ these devices to determine its location with respect to sensors that are configured with location aware devices. In addition, or alternatively, the device controller 232 may select a goal point according to its deviation from the predetermined range, e.g., the goal point with the greatest deviation fro the predetermined range.

In addition, at step 444, the device controller 232 may calculate the amount of energy required for the robotic device 208 to travel to the nearest goal point. The required energy may be calculated based upon the distance to the nearest goal point. If the device controller 232 determines that the robotic device 208 battery has insufficient energy to travel to the nearest goal point, the device controller 232 may cause the robotic device 208 to travel to a re-charging area (not shown). In addition, the device controller 232 may perform this analysis at various times, for example, at pre-set intervals, when the battery charge falls below a predetermined level, etc.

If the device controller 232 determines that the battery has sufficient charge, the device controller 232 may operate the steering/propelling mechanism 238 to cause the robotic device 208 to travel to the nearest goal point at step 446. Once at the goal point, the device controller 232 may activate the sensor 236 to obtain environmental condition(s) at the goal point at step 448. In addition, the device controller 232 may vary the location of the sensor 236 through operation of the arm actuator(s) 234 and/or through operation of the steering/propelling mechanism 238 to obtain environmental condition information at the goal point.

The device controller 232 may transmit the detected condition(s) to the energy manager 204 at step 450. The information transmitted to the energy manager from the device controller 232 may include the location of the robotic device 208 as well as the general condition of the goal point. Data transmission may be accomplished in any of the manners set forth hereinabove. The energy manager 232 may compile the received condition information at step 452. That is, for example, the energy manager 232, and more particularly the controller 210 may store the received condition(s) and the locations from which they were detected in the memory 216. In addition, the controller 210 may more accurately determine the state of the environmental conditions in those locations.

In addition, or alternatively, the device controller 232 may transmit information, e.g., robotic device 208 location and conditions sensed, to the energy manager at various times. For instance, the device controller 232 may be in continuous communication with the energy manager 204, at set time intervals, when there is a change in the robotic device 208 location, or when the robotic device 208 senses one or more conditions that are outside of the predetermined value. Thus, for example, if the robotic device 208 detects a substantially high degree of abnormality, e.g., temperature measurements close to failure limits, the robotic device 208 may substantially immediately transmit this information to the energy manager 204. In this regard, if there is a malfunction in the robotic device 208, there is greater likelihood that the energy manager 204 may have the most current information.

As another example, the robotic device 208 may be programmed to store information relating to its location and detected conditions in the device memory 244. In this regard, for instance, the robotic device 208 may compare previously detected conditions with presently detected conditions to determine whether there are inappropriate fluctuations between the conditions. For instance, the robotic device 208 may determine that a relatively rapid increase in temperature has occurred at a location in the data center and transmit this information to the energy manager 204 even if the present temperature is below a predetermined value. In addition, the robotic device 208 may transmit the stored information to the energy manager 204 at set time intervals.

At step 454, the device controller 232 may determine whether there are additional second category condition locations, e.g., additional goal points. If the device controller 232 determines that there are additional goal points, the device controller 232 may perform step 444 and determine the location of the nearest goal point. In addition, the device controller 232 may repeat steps 444-454 for any additional goal points.

According to an embodiment of the invention, the robotic device 208 may travel to any number of goal points and detect the conditions at those locations prior to transmitting the detected conditions to the energy manager at step 450. Thus, for instance, the robotic device 208 may detect conditions at all of the second category condition locations prior to communicating with the energy manager 204.

If there are no further second category condition locations for the robotic device 208 to obtain environmental condition information, the controller 210 may determine whether alterations to the cooling provisions in those locations and/or throughout the data center are warranted at step 456. If the controller 210 determines that changes in the cooling provisions are required, the controller 210 may manipulate the cooling system 226 components at step 458. For instance, the controller 210 may manipulate one or more vent tiles 214 to vary the flow of cooling fluid from one location to another. As another example, the controller 210 may manipulate the air conditioning unit 212 to vary the temperature and/or output of the cooling fluid delivered through the vent tiles 214. Specific examples of manners in which the cooling system 226 may be manipulated are described in greater detail hereinbelow It should be appreciated that the manipulation of cooling system components at step 458 may be performed substantially simultaneously with condition detection with the robotic device 208 without departing from the scope of the invention.

If the controller 210 determines that cooling provisions do not require alteration, e.g., the environmental condition(s) have stabilized or are decreasing at the first category locations, at step 456, or after manipulation of the cooling system components at step 458, the operational mode 400 may end at step 460. Step 460 may be equivalent to an idle mode since steps 402–458 may be repeated, e.g., in response to a manual instruction, at a predetermined time, etc.

According to embodiments of the invention, the cooling system 226 components may be manipulated in manners similar to those manners described in co-pending U.S. patent application Ser. No. 09/970,707. For example, as described with respect to FIGS. 3A and 3B of that document, components of the cooling system may be manipulated to afford zonal and global temperature control within the data center. In addition, cooling system operations may be based upon detected temperatures and/or pressures at various locations within the data center. In like manners, the components of the cooling system of the present invention may be manipulated to provide local and zonal temperature variations according to the principles set forth in U.S. patent application Ser. No. 09/970,707.

According to additional embodiments of the invention, the cooling system 226 components may be manipulated in manners similar to those manners described in co-pending U.S. patent application Ser. No. 10/210,040. As described in that application, HEU's may be provided to enable generally localized receipt of air and delivery of cooling fluid to the racks of a data center. The control of the cooling fluid delivery and intake of air may be based according to detected temperatures in the vicinities of the racks. The components of the cooling system (e.g., HEU's 172, 174 (FIG. 1D)) of the present invention may be operated in likewise manners.

According to a further embodiment of the invention, the cooling system 226 components may be manipulated in manners similar to those manners described in co-pending U.S. patent application Ser. No. 10/262,879. As described in that application with respect to FIGS. 3A and 3B, components of a cooling system may be manipulated to vary cooling fluid characteristics, e.g., temperature, pressure, volume, etc., in a data center. In addition, a return configured to vary the flow and direction of air intake from the data center may be used to control air removal from the data center. The components of the cooling system (e.g., returns 164, 166 (FIG. 1C)) of the present invention may be operated in likewise manners.

According to yet further embodiments of the invention, the cooling system 226 components may be manipulated in manners similar to those manners described in co-pending U.S. patent application Ser. No. 10/303,761. As set forth in that application, the plenum of a data center may be divided into various zones by controllable partitions. The pressure within the zones may be varied by operation of the controllable partitions and the controllable partitions may be manipulated in response to detected changes in temperature and/or pressure either in the data center or in the zones of the plenum. The data center, e.g., data center 100 (FIGS. 1A and 1B), of the present invention may be provided with the partitions described in U.S. patent application Ser. No. 10/303,761 and may operate in similar manners to those set forth in that application. In this regard, the cooling system components of the present invention may be operated in manners similar to those set forth in U.S. patent application Ser. No. 10/303,761.

According to yet further embodiments of the invention, the cooling system 226 components may be manipulated in manners similar to those manners described in co-pending U.S. patent application Ser. No. 10/351,427. As described in that application, air flow through vents of a cooling system may be varied according to detected pressures in the plenum of a data center. The data center, e.g., data center 100 (FIG. 1B), of the present invention may include similarly configured vents and pressure sensors. In this regard, the cooling system components of the present invention may be manipulated in manners similar to those described in U.S. patent application Ser. No. 10/351,427.

As described in greater detail in the co-pending applications listed hereinabove, a computational fluid dynamics (CFD) tool may be implemented substantially simultaneously with the cooling system 226. More specifically, the CFD tool may be utilized to substantially continuously vary the operation of the cooling system to operate according to the heat loads generated in the racks. In this regard, the anticipated (e.g., based upon the power draw of the components) or actual heat loads on the racks may be inputted into the CFD tool, along with one or more of the following properties: velocity of the cooling fluid flowing through various sections of the room and the distribution of temperature and pressure of the cooling fluid in the data center. These environmental conditions may be detected by the detecting devices, imaged by the reader devices, and transmitted to the cooling system controller.

In this regard, the CFD tool may be implemented to produce a numerical model of the room to thus determine an optimized cooling distribution within the room. A correlation of one or more of the following properties: velocity of the cooling fluid flowing through various sections of the room, distribution of temperature and pressure of the cooling fluid in the room, and the power draw into the racks, may be created based on the numerical modeling. The correlation may be used to infer thermal conditions throughout the room when only a minimum number of sensors are available during operation of the cooling system. In addition, the correlation may substantially reduce the amount of time required for the CFD tool to perform the computing operations. Moreover, the cooling system controller may use the numerical model of the cooling distribution in the data center to manipulate operations of the cooling system components. In this respect, environmental conditions within the data center may be substantially maintained within predetermined operating ranges.

The operations set forth in the operational modes 300 and 400 may be contained as utilities, programs, or subprograms, in any desired computer accessible medium. In addition, the operational modes 300 and 400 may be embodied by computer programs, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
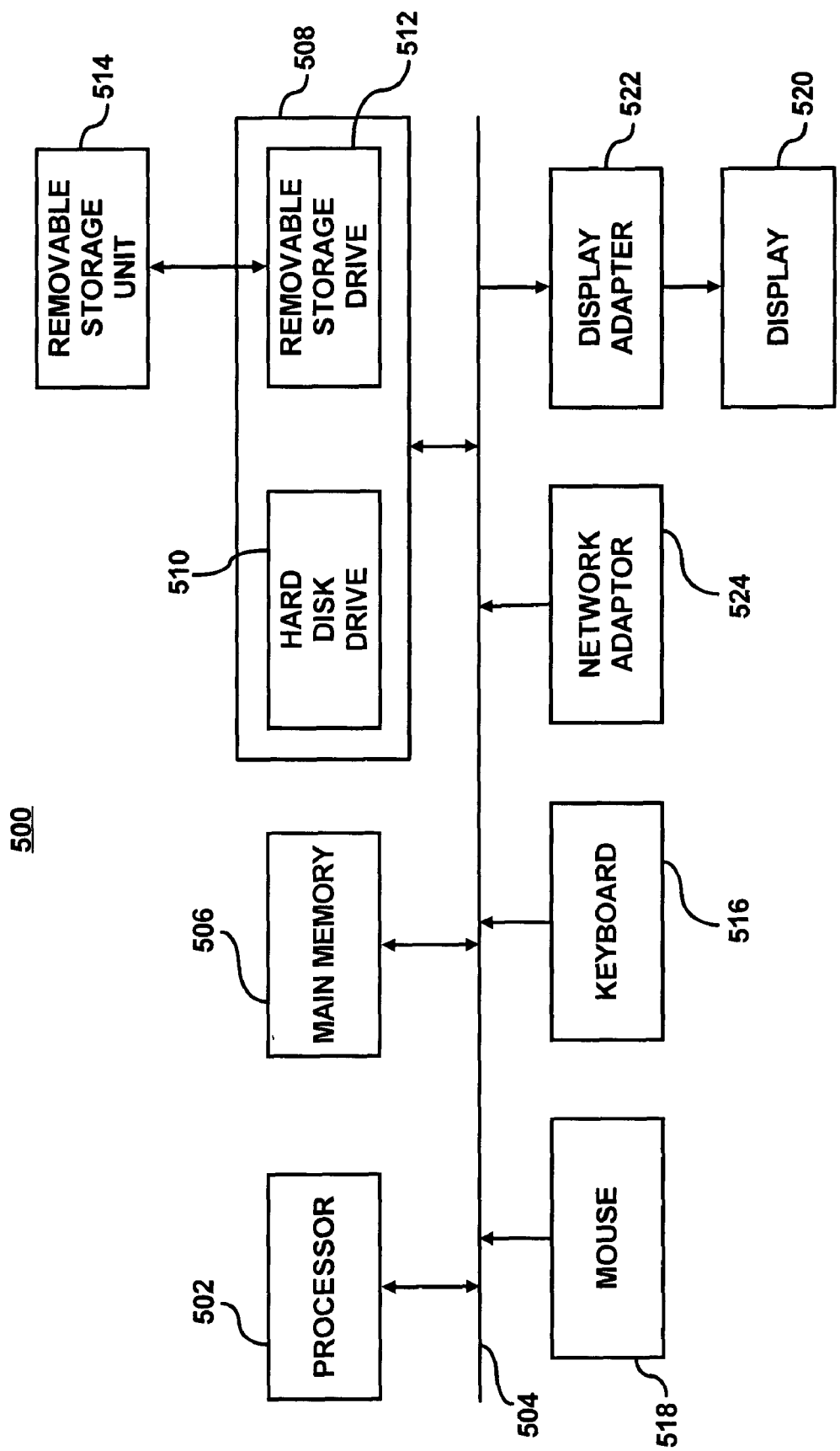
FIG. 5 illustrates an exemplary computer system according to an embodiment of the invention.

FIG. 5 illustrates an exemplary computer system 500, according to an embodiment of the invention. The computer system 500 may include, for example, the energy manager 204 and/or the device controller 232. In this respect, the computer system 500 may be used as a platform for executing one or more of the functions described hereinabove with respect to the energy manager 204 and/or the device controller 232.

The computer system 500 includes one or more controllers, such as a processor 502. The processor 502 may be used to execute some or all of the steps described in the operational modes 300 and 400. Commands and data from the processor 502 are communicated over a communication bus 504. The computer system 500 also includes a main memory 506, e.g., memory 216 and/or 244, such as a random access memory (RAM), where the program code for the energy manager 204 and/or the robotic device 208 may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, e.g., the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (e.g., user input devices, secondary memory, etc.).

By virtue of certain embodiments of the invention, the number of sensors required to adequately detect environmental conditions in a room may be substantially reduced in comparison with known detection systems. Moreover, through various embodiments of the invention, a robotic device may be operated in a substantially optimized manner. For instance, the robotic device may be operated to generally avoid gathering unnecessary to duplicative information. In this respect, the costs associated with detecting environmental conditions in a room may be substantially reduced compared with known detecting techniques.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for semi-autonomous operation of a robotic device in a room, said method comprising:
   determining one or more environmental conditions in the room;
   categorizing the one or more environmental conditions based upon the one or more environmental conditions exceeding a first predetermined value;
   identifying the locations of the one or more environmental conditions that exceed the first predetermined value;
   setting one or more goal points to the locations of the one or more environmental conditions that exceed the first predetermined value;
   calculating the distances between the robotic device and the one or more goal points;
   selecting a first one of the one or more goal points;
   maneuvering the robotic device to travel to the first one of the one or more goal points; and
   performing one or more functions at the first one of the one or more goal points with the robotic device.

2. The method according to claim 1, wherein the step of selecting the first one of the one or more goal points comprises selecting the one or more goal points that is the nearest to the robotic device.

3. The method according to claim 1, wherein the step of selecting the first one of the one or more goal points comprises selecting the one or more goal points that is requires the least amount of travel time for the robotic device.

4. The method according to claim 1, further comprising:
   calculating the distances between the robotic device and the one or more goal points from the location of the first one of the one or more goal points;
   selecting a second one of the one or more goal points;
   maneuvering the robotic device to travel to the second one of the one or more goal points; and
   performing one or more functions at the second one of the one or more goal points with the robotic device.

5. The method according to claim 4, wherein the step of selecting the second one of the one or more goal points comprises selecting the one or more goal points that is the nearest to the robotic device.

6. The method according claim 1, wherein the step of determining one or more environmental conditions comprises detecting one or more environmental conditions with at least one sensor in the room.

7. The method according to claim 6, further comprising:
   storing the one or more goal points in a memory of the robotic device; and
   wherein the step of selecting the first one of the one or more goal points comprises selecting the goal point that is closest to the location of one of the one or more environmental conditions that exceed the first predetermined value.

8. The method according to claim 6, further comprising:
   ranking the one or more environmental conditions according to their deviation from the first predetermined value; and
   wherein the step of selecting the first one of the one or more goal points comprises selecting the one or more goal points associated with an environmental condition that has the greatest deviation from the first predetermined value.

9. The method according to claim 6, further comprising:
   categorizing the one or more environmental conditions based upon the one or more environmental conditions exceeding a second predetermined value and falling below the first predetermined value;
   identifying the locations of the one or more environmental conditions that exceed the second predetermined value and fall below the first predetermined value; and
   wherein the step of setting one or more goal points comprises setting the locations of the one or more environmental conditions that exceed the second predetermined value and fall below the first predetermined value as the one or more goal points.

10. The method according to claim 9, further comprising:
    ranking the one or more environmental conditions according to their deviation from the second predeterminod value; and
    wherein the step of selecting the first one of the one or more goal points comprises selecting the one or more goal points associated with an environmental condition that has the greatest deviation from the second predetermined value.

11. The method according claim 1, wherein the step of determining one or more environmental conditions in the room further comprises creating a predictive modeling of one or more environmental conditions in the room.

12. The method according to claim 11, further comprising:
    categorizing the one or more environmental conditions based upon the one or more environmental conditions exceeding a second predetermined value and falling below the first predetermined value;
    identifying the locations of the one or more environmental conditions that exceed the first predetermined value and fall below the second predetermined value; and
    wherein the step of setting one or more goal points comprises setting the locations of the one or more environmental conditions that exceed the second predetermined value and fall below the first predetermined value as the one or more goal points.

13. The method according to claim 1, wherein the step of performing one or more functions at the first one of the one or more goal points with the robotic device comprises detecting one or more environmental conditions with a sensor of the robotic device.

14. The method according to claim 13, wherein the step of detecting one or more environmental conditions with a sensor of the robotic device comprises detecting a predetermined area around the first one of the one or more goal points.

15. The method according to claim 13, further comprising:
transmitting the detected one or more environmental conditions to an energy manager;
in the energy manager, determining whether cooling provisions should be altered in response to the detected one or more environmental conditions; and
manipulating one or more cooling system components in response to a determination that cooling provisions should be altered.

16. The method according to claim 1, further comprising:
calculating the amount of energy required to maneuver the robotic device to the first one of the one or more goal points;
determining whether a battery of the robotic device has sufficient energy to enable the robotic device to maneuver to the robotic device to the first one of the one or more goal points; and
re-charging the battery in response to the battery having insufficient energy to maneuver the robotic device to the first one of the one or more goal points prior to maneuvering the robotic device to the first one of the one or more goal points.

17. The method according to claim 1, wherein the step of setting one or more goal points comprises setting the one or more goal points in locations around one or more vent tiles, and wherein the step of performing one or more functions at the first one of the one or more goal points with the robotic device comprises detecting the temperature of air exhausting from the first one of the one or more goal points, said method further comprising:
in the energy manager, calculating at least one supply heat index based upon the temperature of the air exhausting from the one or more vent tiles.

18. The method according to claim 17, further comprising:
in the energy manager, determining whether cooling provisions should be altered in response to the calculated at least one supply heat index; and
manipulating one or more cooling system components in response to a determination that cooling provisions should be altered.

19. The method according to claim 1, wherein the step of performing one or more functions at the first one of the one or more goal points with the robotic device comprises performing an inventory function.

20. The method according to claim 1, wherein the step of setting one or more goal points comprises setting at least one of the one or more goal points to include an air conditioning unit, said method further comprising:
imaging the air conditioning unit; and
determining whether the air conditioning unit is operating properly based upon the image of the air conditioning unit.

21. A system for operating a robotic device in a semi-autonomous manner, said system comprising:
a robotic device comprising:
a steering and propelling mechanism;
a guidance sensor;
a device memory configured to store one or more algorithms to operate the steering and propelling mechanism; and
a device controller interfaced with the device memory and configured to control the steering and propelling mechanism and the guidance sensor, wherein said device controller is configured to set one or more goal points, calculate the distances between the location of the robotic device and the one or more goal points, select one of the one or more goal points, control the steering and propelling mechanism to maneuver the robotic device to a first one of the one or more goal points, and perform one or more functions at the first one of the one or more goal points.

22. The system according to claim 21, wherein the device controller is further configured to calculate the distances between the robotic device and the one or more goal points from the location of the first one of the one or more goal points, select a second one of the one or more goal points, maneuver the robotic device to travel to the second one of the one or more goal points, and perform one or more functions at the second one of the one or more goal points with the robotic device.

23. The system according to claim 21, wherein the robotic device further comprises:
an arm assembly having at least one arm actuator, wherein the device controller is configured to manipulate the arm assembly through operation of the at least one arm actuator.

24. The system according to claim 21, wherein the robotic device further comprises:
a sensor configured to detect at least one environmental condition, wherein the device controller is configured to operate the sensor to detect the at least one environmental condition at the one or more goal points.

25. The system according to claim 24, wherein the at least one environmental condition comprises at least one of temperature, pressure and humidity.

26. The system according to claim 21, further comprising:
a sensor network configured to detect at least one environmental condition in various sections of a room;
a cooling system configured to supply cooling fluid to the various sections of a room; and
an energy manager interfaced with the robotic device, wherein the energy manager is configured to receive the at least one environmental condition from the sensor network and the robotic device and to manipulate the cooling system based upon the received at least one environmental condition, and wherein the energy manager is configured to transmit location information at the sensors in the sensor network to the robotic device.

27. The system according to claim 26, wherein the energy manager is further configured to classify the detected at least one environmental condition by the sensor network into a first category and a second category, wherein the first category comprises at least one environmental condition that exceeds a first predetermined value, and wherein the second category comprises at least one environmental condition that exceeds a second predetermined value and falls below the first predetermined value.

28. The system according to claim 27, wherein the energy manager is configured to transmit the classified at least one environmental condition to the robotic device, and wherein the device controller is configured to set the one or more goal points according to the classified at least one environmental condition.

29. The system according to claim 26, wherein the cooling system comprises at least one vent tile and air conditioning unit, and wherein the energy manager is configured to manipulate airflow through the at least one vent tile and air conditioning unit.

30. The system according to claim 26, wherein the energy manager is configured to create a predictive modeling of one or more environmental conditions in the room and categorize the one or more environmental conditions based upon the one or more environmental conditions exceeding a first predetermined value, wherein the energy manager is further configured to identify the locations of the one or more environmental conditions that exceed the first predetermined value and transmit the locations of the one or more environmental conditions to the device controller, and wherein the device controller is configured to the locations of the one or more environmental conditions that exceed the first predetermined value as the one or more goal points.

31. The system according to claim 26, wherein the device controller is configured to set the one or more goal points at one or more vent tiles in the room, and wherein the device controller is further configured to transmit at least one environmental condition detected around the one or more vent tiles to the energy manager, and wherein energy manager is configured to calculate at least one supply heat index of various sections of the room based upon the received at least one environmental condition detected around the one or more vent tiles.

32. The system according to claim 31, wherein the energy manager is configured to determine whether cooling provisions should be altered in response to the calculated at least one supply heat index, and wherein the energy manager is further configured to manipulate one or more cooling system components in response to a determination that cooling provisions should be altered.

33. A system for operating a robotic device in a semi-autonomous manner, said system comprising:
means for steering and propelling the robotic device;
means for guiding the robotic device;
means for storing information in the robotic device; and
means for controlling the steering and propelling means, the guiding means, and the storing means, wherein said controlling means is configured to set one or more goal points, calculate the distances between the location of the robotic device and the one or more goal paints, select one of the one or more goal points, control the steering and propelling mechanism to maneuver the robotic device to a first one of the one or more goal points, and perform one or more functions at the first one of the one or more goal points.

34. The system according to claim 33, wherein the means for controlling is configured to calculate the distances between the robotic device and the one or more goal points from the location of the first one of the one or more goal points, select a second one of the one or more goal points, maneuver the robotic device to travel to the second one of the one or more goal points, and perform one or more functions at the second one of the one or more goal points with the robotic device.

35. The system according to claim 33, further comprising:
means for detecting one or more environmental conditions in a room;
means for categorizing the one or more environmental conditions based upon the one or more environmental conditions exceeding a first predetermined value;
means for identifying the locations of the one or more environmental conditions that exceed the first predetermined value; and
wherein the controlling means is configured to set the locations of the one or more environmental conditions that exceed the first predetermined value as the one or more goal points.

36. The system according to claim 35, further comprising:
means for categorizing to one or more environmental conditions based upon the one or more environmental conditions exceeding a second predetermined value and falling below the first predetermined value;
means for identifying the locations of the one or more environmental conditions that exceed the second predetermined value and fall below the first predetermined value; and
wherein the controlling means is configured to set to locations of the one or more environmental conditions that exceed the second predetermined value and fall below the first predetermined value as the one or more goal points.

37. The system according to claim 33, further comprising:
means for creating a predictive modeling of one or more environmental conditions in the room;
means for categorizing the one or more environmental conditions based upon the one or more environmental conditions exceeding a first predetermined value;
means for identifying the locations of the one or more environmental conditions that exceed the first predetermined value; and
wherein the controlling means is configured to set the locations of the one or more environmental conditions that exceed the first predetermined value as the one or more goal points.

38. The system according to claim 33, wherein the means for controlling is configured to set the one or more goal points in locations around one or more vent tiles and to detect the temperature of air exhausting from the first one of the one or more goal points, the system further comprising:
means for calculating at least one supply heat index based upon the temperature of the air exhausting from the one or more vent tiles;
means for determining whether cooling provisions should be altered in response to the calculated at least one supply heat index; and
means for manipulating one or more cooling system components in response to a determination that cooling provisions should be altered.

39. The system according to claim 33, further comprising:
means for calculating the amount of energy required to maneuver the robotic device to the first one of the one or more goal points;
means for determining whether a battery of the robotic device has sufficient energy to enable the robotic device to maneuver to the robotic device to the first one of the one or more goal points; and
means for re-charging the battery in response to the battery having insufficient energy to maneuver the robotic device to the first one of the one or more goal points prior to maneuvering the robotic device to the first one of the one or more goal points.

40. A computer readable storage medium on which is embedded one or more computer programs, said one or more computer programs implementing a method for semi-autonomous operation of a robotic device in a room, said one or more computer programs comprising a set of instructions for:
determining one or more environmental conditions in the room;

categorizing the one or more environmental conditions based upon the one or more environmental conditions exceeding a first predetermined value;
identifying the locations of the one or more environmental conditions that exceed the first predetermined value;
setting one or more goal points;
calculating the distances between the robotic device and the one or more goal points;
selecting a first one of the one or more goal points;
maneuvering the robotic device to travel to the first one of the one or more goal points; and
performing one or more functions at the first one of the one or more goal points with the robotic device.

41. The computer readable storage medium according to claim 40, said one or more computer programs further comprising a set of instructions for:
calculating the distances between the robotic device and the one or more goal points from the location of the first one of the one or more goal points;
selecting a second one of the one or more goal points;
maneuvering the robotic device to travel to the second one of the one or more goal points; and
performing one or more functions at the second one of the one or more goal points with the robotic device.

42. The computer readable storage medium according to claim 40, said one or more computer programs further comprising a set of instructions for:
detecting one or more environmental conditions with at least one sensor in the room.

43. The computer readable storage medium according to claim 42, said one or more computer programs further comprising a set of instructions for:
categorizing the one or more environmental conditions based upon the one or more environmental conditions exceeding a second predetermined value and falling below the first predetermined value;
identifying the locations of the one or more environmental conditions that exceed the second predetermined value and fall below the first predetermined value; and
wherein the step of setting one or more goal points comprises setting the locations of the one or more environmental conditions that exceed the second predetermined value and fall below the first predetermined value as the one or more goal points.

44. The computer readable storage medium according to claim 40, said one or more computer programs further comprising a set of instructions for:
creating a predictive modeling of one or more environmental conditions in the room.

45. The computer readable storage medium according to claim 40, said one or more computer programs further comprising a set of instructions for:
calculating the amount of energy required to maneuver the robotic device to the first one of the one or more goal points;
determining whether a battery of the robotic device has sufficient energy to enable the robotic device to maneuver to the robotic device to the first one of the one or more goal points; and
re-charging the battery in response to the battery having insufficient energy to maneuver the robotic device to the first one of the one or more goal points prior to maneuvering the robotic device to the first one of the one or more goal points.

46. The computer readable storage medium according to claim 40, said one or more computer programs further comprising a set of instructions for:
setting to one or more goal points in locations around one or more vent tiles;
detecting the temperature of air exhausting from the first one of the one or more goal points;
calculating at least one supply heat index based upon the temperature of the air exhausting from the one or more vent tiles;
determining whether cooling provisions should be altered in response to the calculated at least one supply heat index; and
manipulating one or more cooling system components in response to a determination that cooling provisions should be altered.

* * * * *

UNITED STATES PATENT AND TRADEMARK OFFICE
CERTIFICATE OF CORRECTION

PATENT NO. : 7,031,802 B2
APPLICATION NO. : 10/639428
DATED : April 18, 2006
INVENTOR(S) : Cullen E. Bash et al.

It is certified that error appears in the above-identified patent and that said Letters Patent is hereby corrected as shown below:

In column 27, line 52, in Claim 3, after "that" delete "is".

In column 28, line 37, in Claim 10, delete "predeterminod" and insert -- predetermined --, therefor.

In column 30, line 49, in Claim 26, delete "at" and insert -- of --, therefor.

In column 31, line 44, in Claim 33, delete "paints," and insert -- points, --, therefor.

In column 32, line 6, in Claim 36, delete "to" and insert -- the --, therefor.

In column 32, line 14, in Claim 36, after "to set" delete "to" and insert -- the --, therefor.

In column 34, line 27, in Claim 46, delete "to" and insert -- the --, therefor.

Signed and Sealed this

First Day of September, 2009

David J. Kappos
*Director of the United States Patent and Trademark Office*